(12) United States Patent
Saito et al.

(10) Patent No.: US 10,031,792 B2
(45) Date of Patent: Jul. 24, 2018

(54) FLASH MEMORY

(71) Applicant: Renesas Electronics Corporation, Tokyo (JP)

(72) Inventors: Tomoya Saito, Tokyo (JP); Masamichi Fujito, Tokyo (JP); Koichi Ando, Tokyo (JP); Takashi Hashimoto, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/650,282

(22) Filed: Jul. 14, 2017

(65) Prior Publication Data
US 2018/0067793 A1   Mar. 8, 2018

(30) Foreign Application Priority Data

Sep. 6, 2016   (JP) ................................ 2016-173341

(51) Int. Cl.
*G11C 7/00*   (2006.01)
*G06F 11/07*   (2006.01)

(52) U.S. Cl.
CPC ........ *G06F 11/0727* (2013.01); *G06F 11/073* (2013.01); *G06F 11/0793* (2013.01); *G06F 2212/72* (2013.01)

(58) Field of Classification Search
CPC ............ G11C 11/406; G11C 11/40615; G11C 2211/4061; G11C 11/40618; G11C 2211/4067

(Continued)

(56) References Cited

U.S. PATENT DOCUMENTS 7,106,636 B2 *  9/2006  Eilert ................... G11C 16/06
                                               365/189.05
7,113,441 B2 *  9/2006  Shinozaki ............ G11C 11/406
                                               365/189.04

(Continued)

FOREIGN PATENT DOCUMENTS

JP     2000-011670 A    1/2000
JP     2012-514249 A    6/2012

OTHER PUBLICATIONS

Communication dated Jan. 26, 2018 from the European Patent Office in counterpart European application No. 17187447.2.

*Primary Examiner* — Son Dinh
(74) *Attorney, Agent, or Firm* — Sughrue Mion, PLLC

(57) ABSTRACT

The present invention aims at providing a flash memory that can perform a refresh operation at an appropriate time before a read error occurs. The controller performs the first read operation in which the memory cell as the read target is made to draw out the potential of one of the bit lines, the bit line potential controller is made to draw out the potential of the other of the bit lines at the first speed, and concurrently, the sense amplifier is made to read data; the second read operation in which the memory cell as the read target is made to draw out the potential of one of the bit lines, the bit line potential controller is made to draw out the potential of the other of the bit lines at the second speed faster than the first speed, and concurrently, the sense amplifier is made to read data; and the refresh operation in which, when the data read by the first read operation and the data read by the second read operation are determined to be different, the data stored in the memory cell as the read target is rewritten.

20 Claims, 26 Drawing Sheets

(58) Field of Classification Search
USPC .............................................. 365/222, 189.15
See application file for complete search history.

(56) References Cited

U.S. PATENT DOCUMENTS

| | | |
|---|---|---|
| 8,572,333 B2 | 10/2013 | Confalonieri et al. |
| 2006/0034142 A1 | 2/2006 | Ooishi et al. |
| 2007/0171762 A1 | 7/2007 | Chen et al. |
| 2016/0180948 A1 | 6/2016 | Tanabe |

* cited by examiner

FIG. 7A

|  | BIT LINE | WORD LINE | MEMORY GATE LINE | SOURCE LINE | WELL |
|---|---|---|---|---|---|
| READ OPERATION | 1.5V | 1.5V | 0V | 0V | 0V |
| WRITE OPERATION | 0V | 1.5V | 10V | 6V | 0V |
| ERASE OPERATION | Hi-Z | 1.5V | -10V | 6V | 0V |

FIG. 7B

|  | BIT LINE | WORD LINE | MEMORY GATE LINE | SOURCE LINE | WELL |
|---|---|---|---|---|---|
| READ OPERATION | 1.5V | 1.5V | 0V | 0V | 0V |
| WRITE OPERATION | 0V | 1.5V | 10V | 6V | 0V |
| ERASE OPERATION | Hi-Z | 1.5V | 14V | 0V | 0V |

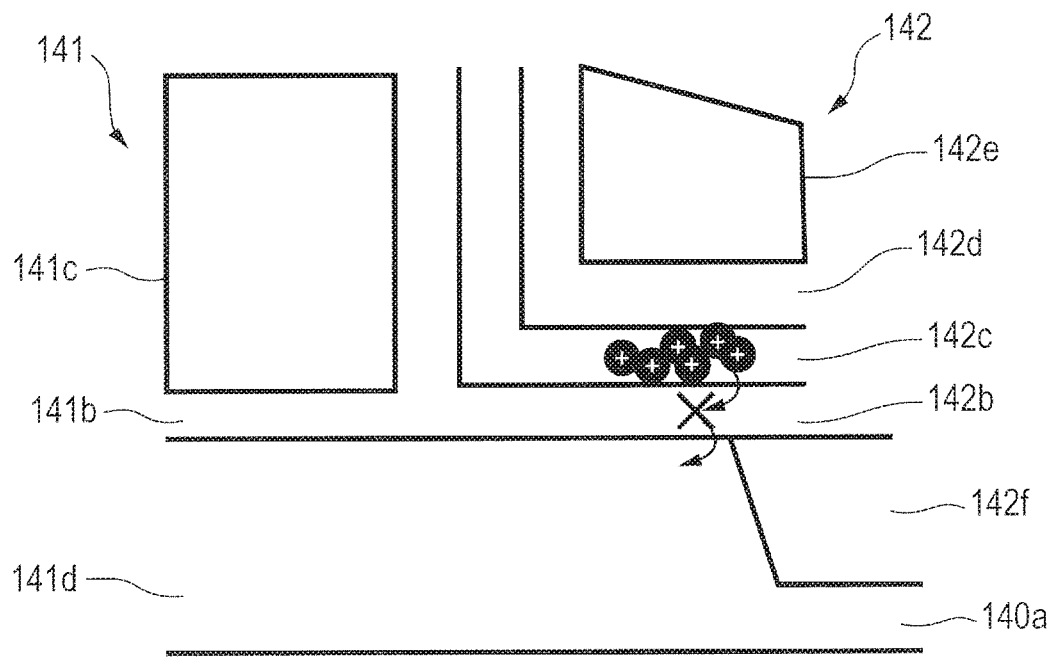
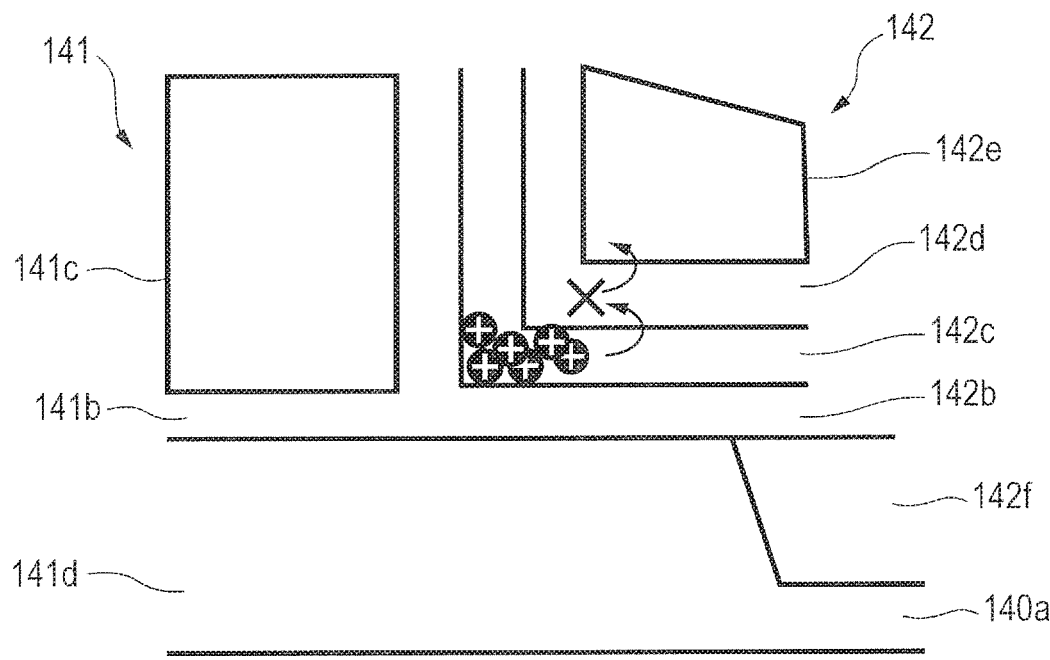

FIG. 12

|  | REFERENCE POTENTIAL SWITCHING SIGNAL ||
|  | S1 | S0 |
| --- | --- | --- |
| NORMAL READ | L | H |
| DATA 1 MARGIN READ (INCREASE OF REFERENCE CURRENT) | L | L |
| DATA 0 MARGIN READ (DECREASE OF REFERENCE CURRENT) | H | H |

NORMAL READ

DATA 1 MARGIN READ

DATA 0 MARGIN READ

INITIALIZATION STATE (DATA "X")

WRITE STATE (DATA "1")

WRITE STATE (DATA "0")

*FIG. 19*

|  | POTENTIAL DRAWING-OUT SWITCHING SIGNAL ||
|  | refdcjn | refdckn |
| --- | --- | --- |
| NORMAL READ | H | H |
| DATA 1 MARGIN READ | H | L |
| DATA 0 MARGIN READ | L | H |

FIG. 21A

NORMAL READ

|  | POTENTIAL DRAWING-OUT SWITCHING SIGNAL ||
|  | refdcjn (POSITIVE MEMORY SIDE) | refdckn (NEGATIVE MEMORY SIDE) |
| --- | --- | --- |
| READ DATA "1" | H | H |
| READ DATA "0" | H | H |

FIG. 21B

L-SIDE DATA MARGIN READ

|  | POTENTIAL DRAWING-OUT SWITCHING SIGNAL ||
|  | refdcjn (POSITIVE MEMORY SIDE) | refdckn (NEGATIVE MEMORY SIDE) |
| --- | --- | --- |
| READ DATA "1" | H | L |
| READ DATA "0" | L | H |

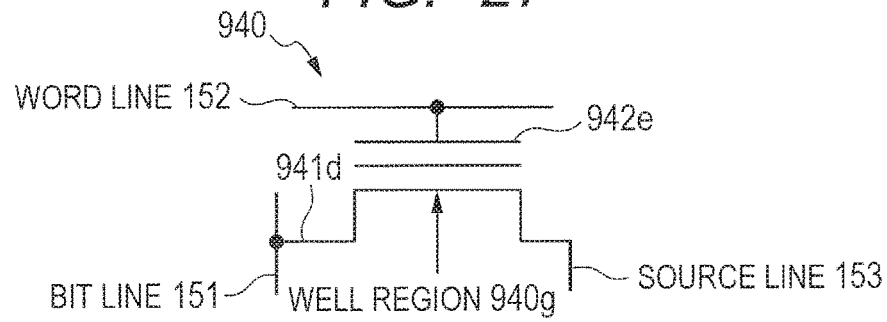
FIG. 27
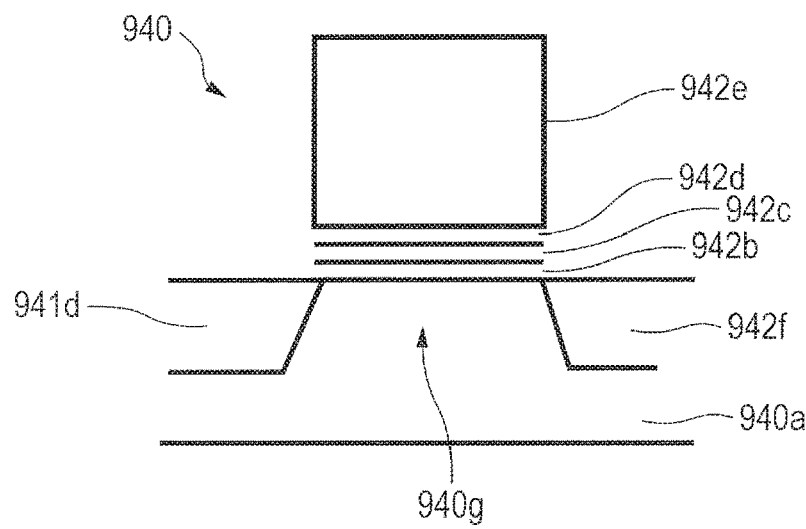
FIG. 28
FIG. 29
|  | BIT LINE | WORD LINE | SOURCE LINE | WELL |
|---|---|---|---|---|
| READ OPERATION | 1.5V | 1.5V | 0V | 0V |
| WRITE OPERATION | -4V | 6V | -4V | -4V |
| ERASE OPERATION | 6V | -4V | 6V | 6V |

FLASH MEMORY

CROSS-REFERENCE TO RELATED APPLICATIONS

The disclosure of Japanese Patent Application No. 2016-173341 filed on Sep. 6, 2016 including the specification, drawings and abstract is incorporated herein by reference in its entirety.

BACKGROUND

The present invention relates to a flash memory.

The flash memory is employed for a memory device such as a USB memory and a memory card. In addition to this, the flash memory is also mounted in a micro controller to store data used by the micro controller.

The flash memory is a nonvolatile memory and the rewritten data is stored in a memory cell. However, depending on the conditions after the data is rewritten, a threshold voltage in the memory cell may be varied significantly so that the data may not be properly read any longer.

For example, Patent Literature 1 discloses a nonvolatile memory comprised of a temperature sensor and a timer, in which the timer measures a period when the temperature measured with the temperature sensor exceeds a threshold temperature, and when the measured period reaches a threshold, refresh is performed.

As another example, Patent Literature 2 discloses equipment comprised of a nonvolatile memory. The nonvolatile memory is comprised of a timer to measure an elapsed time after performing a write operation to the nonvolatile memory, a temperature sensor to measure temperature near the nonvolatile memory, and a counter to count the number of times of the write operation to the nonvolatile memory. After weighting the period measured with the timer, based on the temperature measured with the temperature sensor and on the number of times of the write operation counted with the counter, a rewrite operation is performed to the nonvolatile memory when the weighted elapsed time measured with the timer exceeds a prescribed period.

PATENT LITERATURE (Patent Literature 1) Japanese Unexamined Patent Application Publication (Translation of PCT Application) No. 2012-514249

(Patent Literature 2) Japanese Unexamined Patent Application Publication No. 2000-11670

SUMMARY

However, in Patent Literature 1, if the power supply is not turned on, there is no means to measure the period when the temperature of the nonvolatile memory exceeds the threshold temperature. Accordingly, it is difficult to measure correctly the period when the temperature of the nonvolatile memory exceeds the threshold temperature. Also in Patent Literature 2, if the power supply is not turned on, the timer cannot measure the elapsed time after the write operation. Accordingly, it is difficult to count the number of times of the write operation to the nonvolatile memory by the counter. Therefore, the timing of the refresh operation is delayed and data may not be read properly. When the timing of the refresh operation is specified by the period (time), an unnecessary refresh operation may be performed.

The present invention is made in view of the above, and aims at providing a flash memory that can perform a refresh operation at an appropriate time before a read error occurs.

The outline of a typical invention disclosed by the present application will be explained briefly as follows.

A flash memory according to a typical embodiment of the present invention is comprised of: multiple memory cells; a sense amplifier that is coupled, at an input terminal, to a pair of bit lines coupled to the mutually different memory cells, and that reads data stored in the memory cell as a read target, based on potential of one of the bit lines and potential of the other of the bit lines, coupled to the memory cell as the read target; a bit line potential controller to draw out the potential of the bit line; and a controller. The controller performs a first read operation, a second read operation, and a refresh operation. In the first read operation, the memory cell as the read target is made to draw out the potential of the one of the bit lines, the bit line potential controller is made to draw out the potential of the other of the bit lines at a first speed, and concurrently, the sense amplifier is made to read the data. In the second read operation, the memory cell as the read target is made to draw out the potential of the one of the bit lines, the bit line potential controller is made to raw out the potential of the other of the bit lines at a second speed faster than the first speed, and concurrently, the sense amplifier is made to read the data. In the refresh operation, the data read by the first read operation and the data read by the second read operation are compared, and when the data read by the first read operation and the data read by the second read operation are determined to be different, the data stored in the memory cell as the read target is rewritten in the memory cell as the read target.

The effect obtained by the typical invention disclosed by the present application will be explained briefly as follows.

That is, according to the typical embodiment, it becomes possible to perform a refresh operation at the appropriate time before a read error occurs.

BRIEF DESCRIPTION OF THE DRAWINGS

FIG. 7A and FIG. 7B are tables illustrating an example of the voltage applied to the memory cell in each operation;

FIG. 10A and FIG. 10B are drawings illustrating the situation of degradation of the data holding characteristics;

FIG. 12 is a drawing illustrating a list of register outputs at the time of each read operation according to Embodiment 1 of the present invention;

FIG. 19 is a drawing illustrating the list of the potential applied to a potential drawing-out unit at the time of each read operation according to Embodiment 3 of the present invention;

FIG. 21A and FIG. 21B are drawings illustrating the list of the potential applied to a potential drawing-out unit at the time of each read operation according to Embodiment 5 of the present invention;

FIG. 27 is a drawing illustrating an example of the circuit configuration of a memory cell according to Embodiment 9 of the present invention;

FIG. 28 is a sectional view illustrating an example of the configuration of a memory cell according to Embodiment 9 of the present invention; and FIG. 29 is a drawing illustrating an example of the voltage applied to the memory cell in each operation.

DETAILED DESCRIPTION

Hereinafter, the embodiment of the present invention is described in detail, with reference to the drawings. In the entire diagrams to explain the embodiments of the present invention, the same symbol is attached to the same element in principle, and the repeated explanation thereof is omitted.

Embodiment 1

<The Configuration of a Micro Controller>

Figure 1:
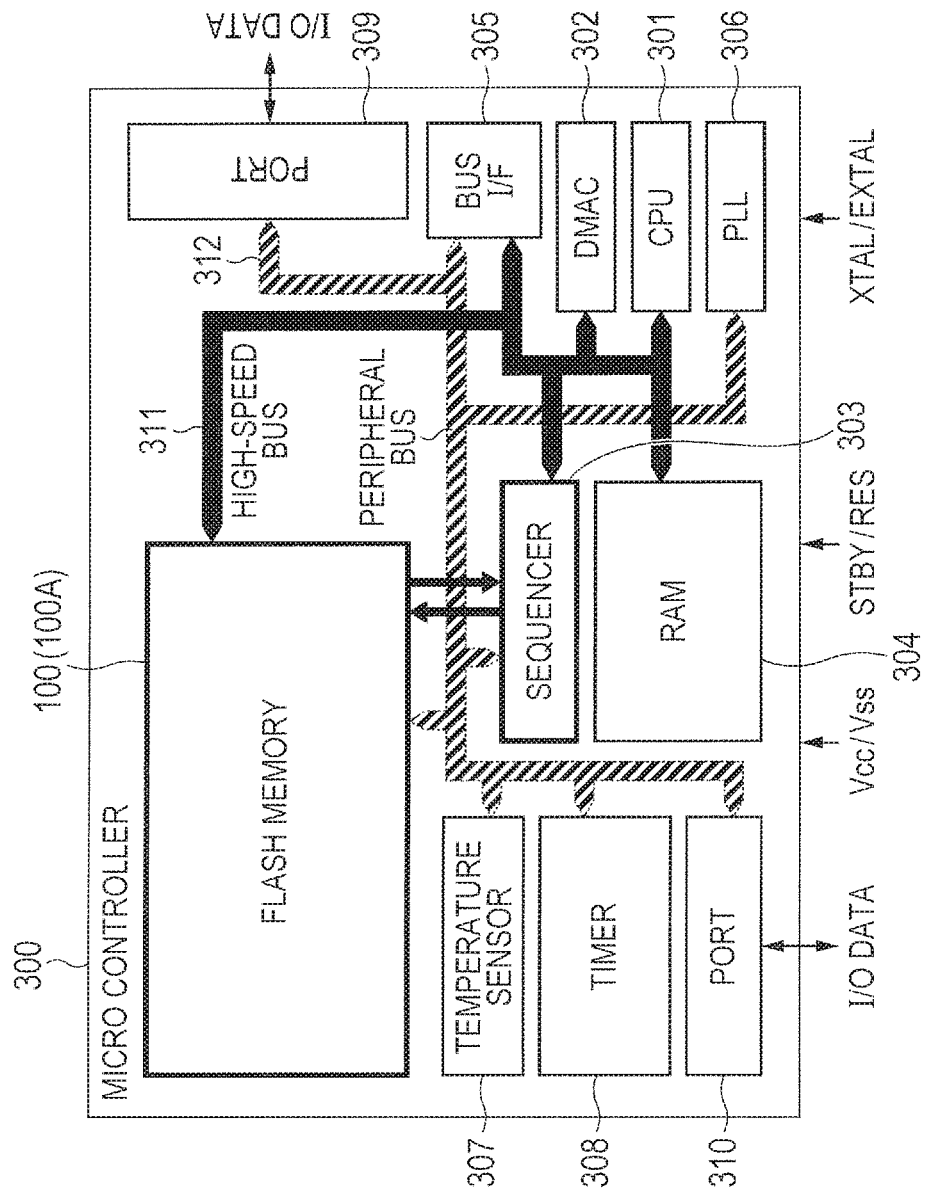
FIG. 1 is a block diagram illustrating an example of the configuration of a micro controller that mounts a flash memory according to Embodiment 1 of the present invention.

FIG. 1 is a block diagram illustrating an example of the configuration of a micro controller that mounts a flash memory according to Embodiment 1 of the present invention. As illustrated in FIG. 1, the micro controller 300 is comprised of a flash memory 100, a CPU (Central Processing Unit) 301, a DMAC (Direct Memory Access Controller) 302, a sequencer 303, a RAM (Random Access Memory) 304, a bus interface (bus I/F) 305, a PLL (Phase Locked Loop) 306, a temperature sensor 307, a timer 308, ports 309 and 310, a high-speed bus 311, and a peripheral bus 312.

The flash memory 100, the CPU 301, the DMAC 302, the sequencer 303, the RAM 304, and the bus interface 305 are mutually coupled via the high-speed bus 311, and data input/output among these units is performed via the high-speed bus 311. With the high-speed bus 311, the data input/output is performed at higher speed than with the peripheral bus 312.

The flash memory 100, the bus interface 305, the PLL 306, the temperature sensor 307, the timer 308, and the ports 309 and 310 are mutually coupled via the peripheral bus 312, and data input/output among these units is performed via the peripheral bus 312.

The CPU 301 controls each unit configuring the micro controller 300. For example, the CPU 301 performs data input/output to and from the flash memory 100. The CPU 301 controls data input/output to be performed among the units such as the flash memory 100 and the peripheral circuit, via the DMAC 302, as will be described later. The CPU 301 instructs the sequencer 303 to perform the sequence control related to each of operations such as an erase operation, a rewrite (write) operation, and a read operation to the flash memory 100. The CPU 301 performs data input/output to and from each unit coupled to the peripheral bus 312, via the bus interface 305.

Based on instructions by the CPU 301 for example, the DMAC 302 performs data input/output between the flash memory 100 and the peripheral circuit for example, without passing the CPU 301.

The sequencer 303 performs the sequence control over the flash memory 100. Based on the instructions from the CPU 301 and the DMAC 302 for example, the sequencer 303 performs sequence control to each unit configuring the flash memory 100 (to be described later) with respect to each of operations such as an erase operation, a rewrite (write) operation, and a read operation in the flash memory 100.

The RAM 304 is a volatile memory such as a DRAM and an SRAM. In the RAM 304, various kinds of programs to operate the micro controller 100 for example are expanded. The CPU 301 executes the expanded program, to realize various kinds of function in the program. In the RAM 304, various kinds of data handled by the CPU 301 are stored temporarily.

The bus interface 305 couples the high-speed bus 311 and the peripheral bus 312, and performs data input/output among each of the units coupled via the different buses. For example, the CPU 301 and the PLL 306 are coupled via the bus interface 305, and a clock signal outputted from the PLL 306 is inputted into the CPU 301. The CPU 301 is coupled to the temperature sensor 307 via the bus interface 305, and temperature data (for example, a value of resistance) outputted from, the temperature sensor 307 is inputted into the CPU 301. The CPU 301 is coupled to the timer 308 via the bus interface 305, and time data outputted from the timer 308 is inputted into the CPU 301. The CPU 301 is coupled to the ports 309 and 310 via the bus interface 305, data to be inputted into the external device is outputted from, the CPU 301 to the ports 309 and 310, and data outputted from the external device is inputted into the CPU 301.

The PLL 306 is a phase-locked loop having a crystal oscillator for example. The PLL 306 is coupled to an XTAL terminal on the input side, and an EXTAL terminal on the output side. The PLL 306 generates a clock signal of a predetermined frequency based on a signal inputted from the XTAL terminal. Alternatively, the PLL 306 generates multiple clock signals having respectively different frequencies, based on a signal inputted from the XTAL terminal. The generated clock signal is inputted into each unit of the micro controller 300 via the peripheral bus 312.

The temperature sensor 307 measures the temperature of the micro controller 300. For example, the temperature sensor 307 is comprised of a resistor made from metal for example, and outputs to the CPU 301 a value of resistance as the temperature data.

The timer 308 measures a time based on a clock generated inside the micro controller 100 or a clock inputted from the exterior. For example, the timer 308 measures the elapsed time from, a prescribed time of day based on the count, number of the clock and the frequency of the clock. The timer 308 outputs to the CPU 301 the measured elapsed time as the time data, for example.

The ports 309 and 310 are external interfaces to couple the micro controller 100 with an external device (not shown). Data input/output is performed between the micro controller 300 and the external device via the ports 309 and 310. For example, the data outputted from the CPU 301 is inputted into the external device via the ports 309 and 310. The data outputted from, the external device is inputted into the CPU 301 via the ports 309 and 310.

The micro controller 300 is provided, with plural power supply terminals, and a high potential Vcc and a low potential Vss are supplied via the respective power supply terminal.

The micro controller 300 is also provided with a standby terminal into which a standby signal STBY is inputted, and a reset terminal into which a reset signal RES is inputted. When the standby signal STBY becomes effective, the micro controller 300 makes a transition to a standby state. When the reset signal RES becomes effective, the micro controller 300 is initialized.

Figure 2:
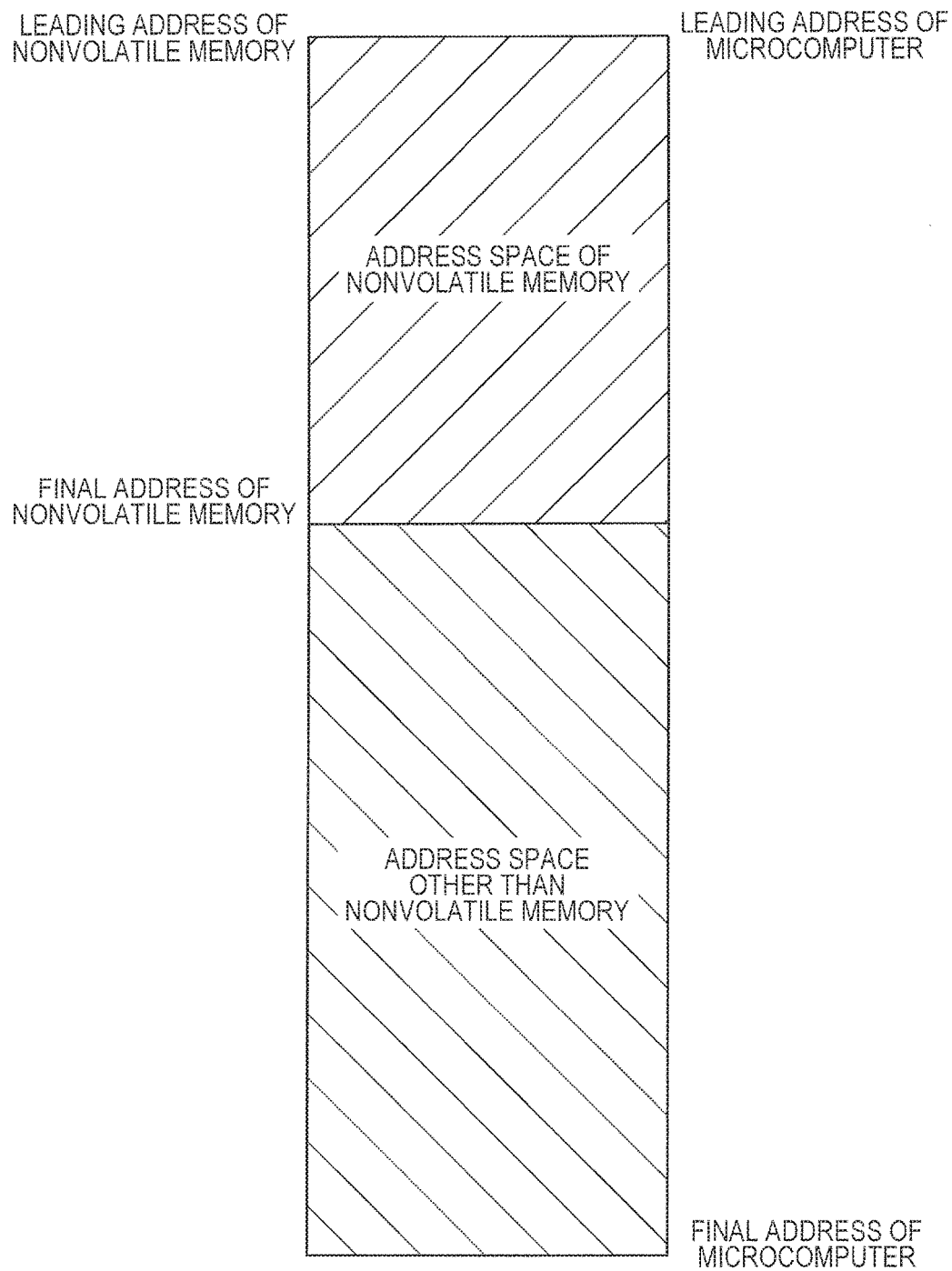
FIG. 2 is a drawing illustrating an example of the address map in the micro controller.

FIG. 2 illustrates an example of an address map in the micro controller. The address space of the micro controller 300 is comprised of an address map of the flash memory 100, and an address map other than the flash memory 100, as shown in FIG. 2 for example. FIG. 2 illustrates the case where the leading address of the micro controller 300 is equal to the leading address of the flash memory 100. In this case, the space from the leading address of the flash memory 100, i.e., the leading address of the micro controller 300, to the final address of the flash memory 300 is the address space of the flash memory 100, and the space from the next address of the final address of the flash memory 100 to the final address of the micro controller 300 is the address space of other memory than the flash memory 100.

<A Configuration of the Flash Memory>

Figure 3:
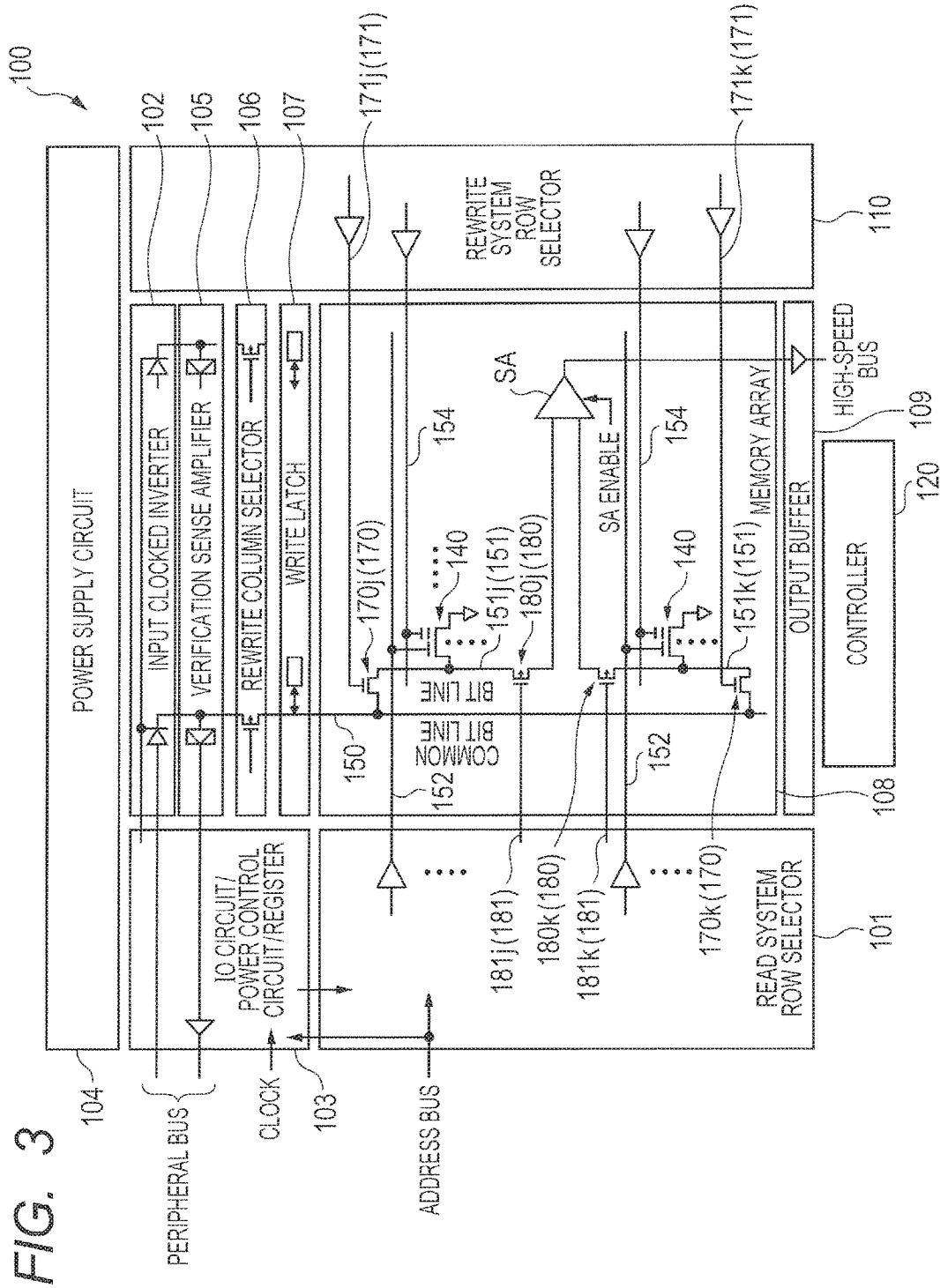
FIG. 3 is a drawing illustrating an example of the configuration of the flash memory according to Embodiment 1 of the present invention.

FIG. 3 illustrates an example of the configuration of the flash memory according to Embodiment 1 of the present invention. As illustrated in FIG. 3, the flash memory 100 is typically comprised of a read system row selector 101, an input clocked inverter 102, an IO (input-output) circuit/ power control circuit/register 103, a power supply circuit 104, a verification sense amplifier 105, a rewrite column selector 106, a write latch 107, a memory array 108, an output buffer 109, a rewrite system, row selector 110, and a controller 120.

The read system row selector 101 selects a read system row (word) in the memory array 108, based on the decoded result of the address signal inputted via the high-speed bus (also called an address bus) 311.

The input clocked inverter 102 generates a signal to specify various kinds of timing in a write operation, an erase operation, and a read operation, for example, based on a signal inputted from the IO circuit/power control circuit/ register 103 to be described later.

The IO circuit/power control circuit/register 103 controls the data input/output to and from, the peripheral bus 312, in synchronization with a clock signal inputted via the peripheral bus 312. The IO circuit/power control circuit/register 103 also controls the operation of the power supply circuit 104 to be described later. The IO circuit/power control circuit/register 103 also outputs write data inputted via the high-speed bus 311 to the write latch 107. The IO circuit/ power control circuit/register 103 also outputs write data inputted from the controller 120 (to be described later) to the write latch 107.

The power supply circuit 104 generates several kinds of voltages to be used in the flash memory 100. For example, the power supply circuit 104 generates the potential of each power supply, such as a high-potential-side power source Vdd and a low-potential-side power source Vss.

When performing the write operation to the memory array 108, the verification sense amplifier 105 performs verification to confirm whether the write data and the written data are the same.

The rewrite column selector 106 selects a rewrite column (common bit line) at the time of performing a write operation to the memory array 108, based on the signal generated by the input clocked inverter 102, for example.

The write latch 107 holds temporarily the write data outputted from the IO circuit/power control circuit/register 103. The write latch 107 outputs the write data currently held to a main bit line, based on the signal generated by the input clocked inverter 102, for example.

The memory array 108 is comprised of an arrangement of multiple memory mats. The details of the memory array 108 will be described later.

The output buffer 109 outputs the data read from the memory array 108 to the CPU 301, the DMAC 302, and the RAM 304 for example, via the high-speed bus 311. The output buffer 109 outputs the data read from the memory array 108 also to the controller 120 to be described later.

The rewrite system row selector 110 selects a rewrite system row (for example, a memory gate line) in the memory array 108, based on the decoded result of the address signal inputted via the high-speed bus 311.

The controller 120 compares the data read by the normal read (the first read operation) to be described later with the data read by a data 1 margin read (the second read operation) to be described later. When it is determined that the data read by the normal read and the data read by the data 1 margin read are different, the controller 120 performs a refresh operation in which the data stored in the memory cell 140 as a read target to be described later is rewritten to the memory cell 140 as the read target. When it is determined that the data read by the normal read and the data read by the data 1 margin read are the same, the controller 120 compares the data read by the normal read with the data read by a data 0 margin read (the third read operation) to be described later. When it is determined that the data read by the normal read is different from the data read by the data 0 margin read, the controller 120 performs the refresh operation described above.

Figure 4:
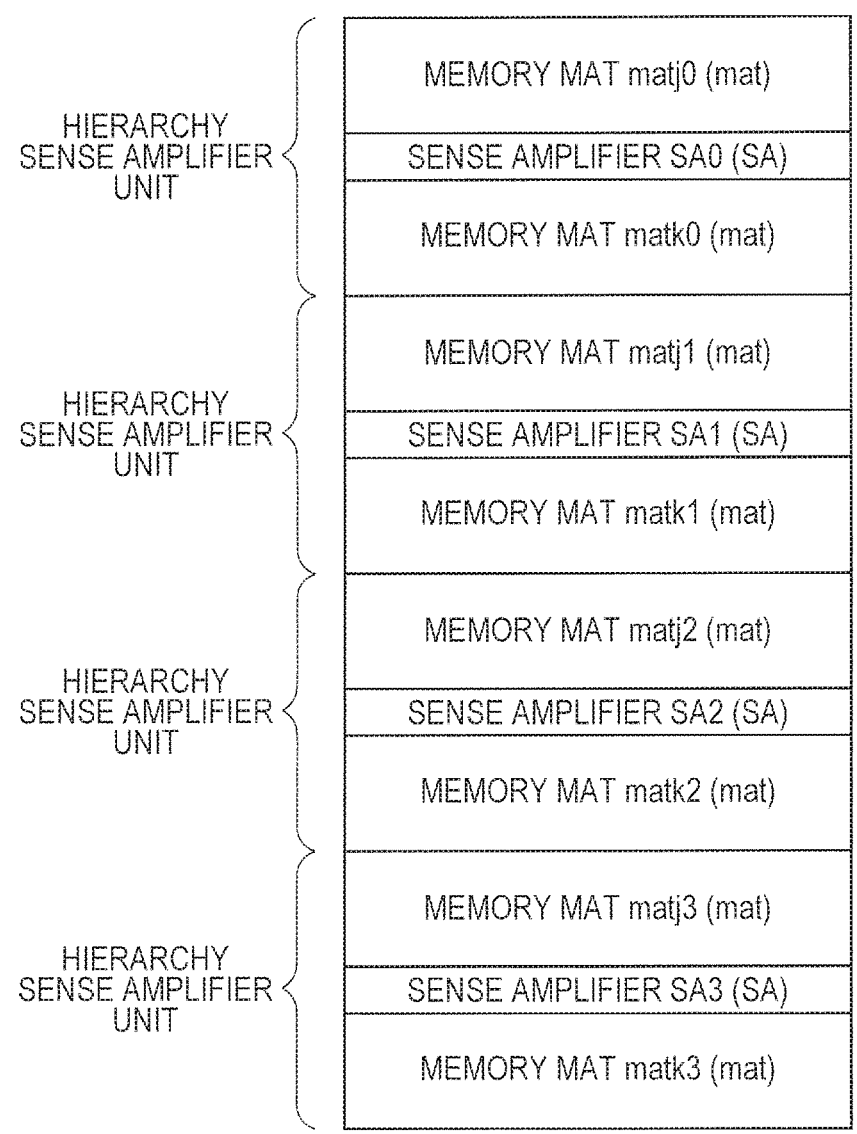
FIG. 4 is a drawing illustrating an example of the configuration of a memory array according to Embodiment 1 of the present invention.
Figure 5:
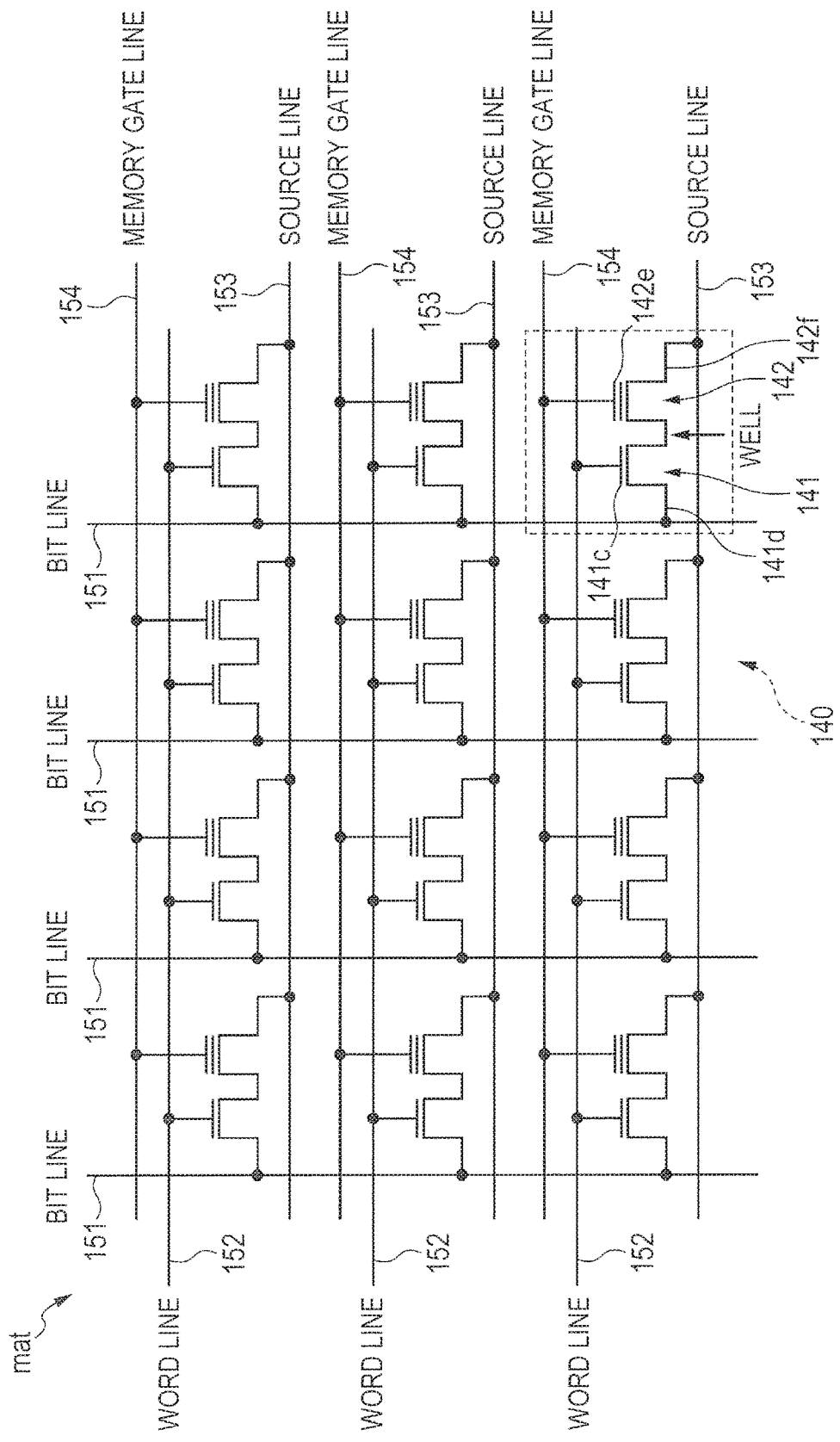
FIG. 5 is an enlarged drawing illustrating a part of the configuration of a memory mat according to Embodiment 1 of the present invention.
Figure 6:
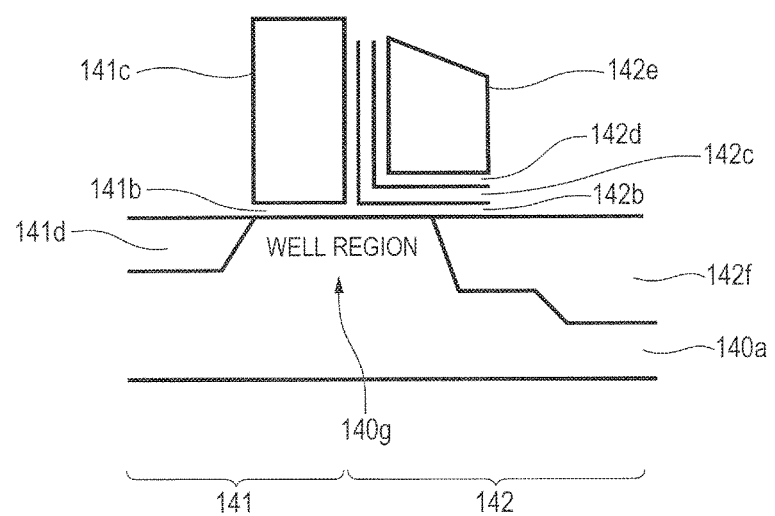
FIG. 6 is a sectional view illustrating an example of the configuration of a memory cell according to Embodiment 1 of the present invention.

Next, the memory array 108 is explained. FIG. 4 illustrates an example of the configuration of a memory array according to Embodiment 1 of the present invention. FIG. 5 is an enlarged drawing illustrating a part of the configuration of a memory mat according to Embodiment 1 of the present invention. FIG. 6 is a sectional view illustrating an example of the configuration of a memory cell according to Embodiment 1 of the present invention.

The memory array 108 includes multiple memory mats mat, as illustrated in FIG. 4. As illustrated in FIG. 5, in the memory mat mat, multiple memory cells 140 are arranged in a matrix in the column direction (the second direction) and the row direction (the first direction), and multiple bit lines 151 (151*j*, 151*k*) are provided for every memory cells 140 for one column arranged in the column direction.

The sense amplifier SA is provided for every pair of memory mats mat, as illustrated in FIG. 4. The bit line 151 (151*j*, 151*k*) of each memory mat mat is coupled to the input terminal of the sense amplifier SA via a read memory cell selecting-switching element 180 (180*j*, 180*k*), as illustrated in FIG. 3. The read memory cell selecting-switching element 180 (180*j*, 180*k*) is comprised of a MOS (metal-oxide-semiconductor) transistor, for example. The gate of the read memory cell selecting-switching element 180 (180*j*, 180*k*) is coupled to the memory cell selecting line 181 (181*j*, 181*k*). The memory cell selecting line 181 (181*j*, 181*k*) is coupled to the read system row selector 101.

As illustrated in FIG. 3, each bit line 151 (151*j*, 151*k*) is coupled to a common bit line 150 common to multiple memory mats mat, via a bit line selecting-switching element 170 (170*j*, 170*k*). The bit line selecting-switching element 170 (170*j*, 170*k*) is comprised of a MOS transistor, for example. A gate of the bit line selecting-switching element 170 (170*j*, 170*k*) is coupled to a bit line selecting line 171 (171*j*, 171*k*), which is further coupled to the rewrite system row selector 110, for example.

A pair of the memory mats mat configure a hierarchy sense amplifier unit, as illustrated in FIG. 4. For example, a memory mat matj0 and a memory mat matk0 configure a hierarchy sense amplifier unit, and a sense amplifier SA0 is provided between the memory mat matj0 and the memory mat matk0, as illustrated in FIG. 4. A memory mat matj1 and a memory mat matk1 configure a hierarchy sense amplifier unit, and a sense amplifier SA1 is provided between the memory mat matj1 and the memory mat matk1, as illustrated in FIG. 4. A memory mat matj2 and a memory mat matk2 configure a hierarchy sense amplifier unit, and a sense amplifier SA2 is provided between the memory mat matj2 and the memory mat matk2, as illustrated in FIG. 4. A memory mat matj3 and a memory mat matk3 configure a hierarchy sense amplifier unit, and a sense amplifier SA3 is provided between the memory mat matj3 and the memory mat matk3, as illustrated in FIG. 4. Here, the example is illustrated for the configuration in which eight memory mats matj0 to matj3 and matk0 to matk3, and four sense amplifiers SA0 to SA3 corresponding to these memory mats mat are provided. However, the configuration is not restricted to one described above.

In this way, in the present embodiment, the memory array 108 is divided into plural (for example, four) hierarchy sense amplifier units, and a write operation, an erase operation, and a read operation to be described later are performed in the selected hierarchy sense amplifier unit.

It is preferable that the memory cells 140 for one line arranged in the column direction in each memory mat mat are the same in number. According to the present setting, it is possible to suppress the variations in wiring load for every bit line 151 (151*j*, 151*k*); accordingly, it is possible to suppress occurrence of errors at the time when the sense amplifier SA reads the data.

<A Configuration of the Memory Cell>

The memory cell 140 includes a selection transistor 141 and a memory transistor 142, as illustrated in FIG. 5 and FIG. 6. For example, as illustrated in FIG. 6, a WELL region 140*g* common to the memory cells 140 is formed over a semiconductor substrate 140*a*, and the selection transistor 141 and the memory transistor 142 are formed over the WELL region 140*g*. The selection transistor 141 is comprised of a MOS transistor, for example. Specifically, as illustrated in FIG. 6, the selection transistor 141 has the configuration in which a gate oxide layer (oxide) 141*b* and a control gate (metal) 141*c* are laminated over the WELL region 140*g* of the semiconductor substrate (semiconductor) 140*a*.

The memory transistor 142 is an MONOS (metal-oxide-nitride-oxide-silicon) type transistor, for example. As illustrated in FIG. 6, the memory transistor 142 has a structure in the area near a source 142*f*, in which an oxide layer (oxide) 142*b*, a nitride layer (nitride) 142*c*, an oxide layer (oxide) 142*d*, and a memory gate (metal) 142*e* are laminated over the WELL region 140*g* of the semiconductor substrate (semiconductor) 140*a*.

Near the boundary of the selection transistor 141 and the memory transistor 142, the oxide layer (oxide) 142*b*, the nitride layer (nitride) 142*c*, and the oxide layer (oxide) 142*d* are extended to the perpendicular upper part so as to split the control gate 141*c* and the memory gate 142*e*. In this way, the memory cell 140 has the MONOS structure of a split gate type in which the control gate 141*c* and the memory gate 142*e* are split. The nitride layer 142*c* is sandwiched by the oxide layers 142*b* and 142*d* as insulating layers, and acts as a charge capture layer insulated electrically. That is, the memory cell 140 is formed by the charge capture-type memory system.

A drain 141*d* of the selection transistor 141 is coupled to the bit line 151 (151*j*, 151*k*), as illustrated in FIG. 5. The control gate 141*c* of the selection transistor 141 is coupled to a word line 152, as illustrated in FIG. 5. The word line 152 is provided for every row of the memory mat 108. That is, the word line 152 is coupled to the memory cells 140 arranged in the row direction (the first direction). The word line 152 is coupled to the read system row selector 101, as illustrated in FIG. 3. The source 142*f* of the memory transistor 142 is coupled to a source line 153 common to the memory cells 140, as illustrated in FIG. 5. The memory gate 142*e* of the memory transistor 142 is coupled to a memory gate line 154, as illustrated in FIG. 5. The memory gate line 154 is provided for every row of the memory mat 108. That is, the memory gate line 154 is coupled to the memory cells 140 arranged in the row direction (the first direction). The memory gate line 154 is coupled to the rewrite system row selector 110, as illustrated in FIG. 3.

FIG. 7A and FIG. 7B illustrate an example of the voltages applied to the memory cell in each operation. FIG. 7A and FIG. 7B illustrate voltages applied to the bit line 151, the control gate 141*c*, the memory gate 142*e*, the source line 153, and the WELL region 140*g*, in the write operation, the erase operation, and the read operation. FIG. 7A illustrates the case where the erase operation is performed by the method called BTBTHH (Band-to-band Tunneling Hot Hole) to be described later. According to FIG. 7A for example, at the time of the write operation, a voltage of 0V is applied to the bit line 151, a voltage of 1.5V is applied to the control gate 141c, a voltage of 10V is applied to the memory gate 142e, a voltage of 6V is applied to the source line 153, and a voltage of 0V is applied to the WELL region 140g. At the time of the write operation, a hot electron (electron) of high efficiency is injected into the nitride layer 142c by the method called SSI (Source Side Injection), for example. The memory cell 140 to which the write operation has been performed stores data "0."

For example, at the time of the erase operation, the bit line 151 is set at high impedance, a voltage of 1.5V is applied to the control gate 141c, a voltage of −10V is applied to the memory gate 142e, a voltage of 6V is applied to the source line 153, and a voltage of 0V is applied to the WELL region 140g. The erase operation is performed in units of blocks including the plural memory cells 140, for example. At the time of the erase operation, a hot hole (hole) is injected into the nitride layer 142c by the BTBTHH method, for example. The memory cell 140 to which the erase operation has been performed stores data "1."

For example, at the time of the read operation, a voltage of 1.5V is applied to the bit line 151, a voltage of 1.5V is applied to the control gate 141c, a voltage of 0V is applied to the memory gate 142e, a voltage of 0V is applied to the source line 153, and a voltage of 0V is applied to the WELL region 140g.

FIG. 7B illustrates the case where the erase operation is performed by an FN tunnel system to be described later. According to FIG. 7B, the potentials applied to each part in the write operation and the read operation are the same as in FIG. 7A. Accordingly, the detailed explanation thereof is omitted. At the time of the erase operation, for example, the bit line 151 is set at high impedance, a voltage of 1.5V is applied to the control gate 141c, a voltage of 14V is applied to the memory gate 142e, a voltage of 0V is applied to the source line 153, and a voltage of 0V is applied to the WELL region 140g. The erase operation is performed in units of blocks including the plural memory cells 140, for example. At the time of the erase operation, a hole is injected into the nitride layer 142c by the tunnel phenomenon from the memory gate 142e according to the FN tunnel system, for example. The memory cell 140 to which the erase operation has been performed stores data "1."

Figure 8:
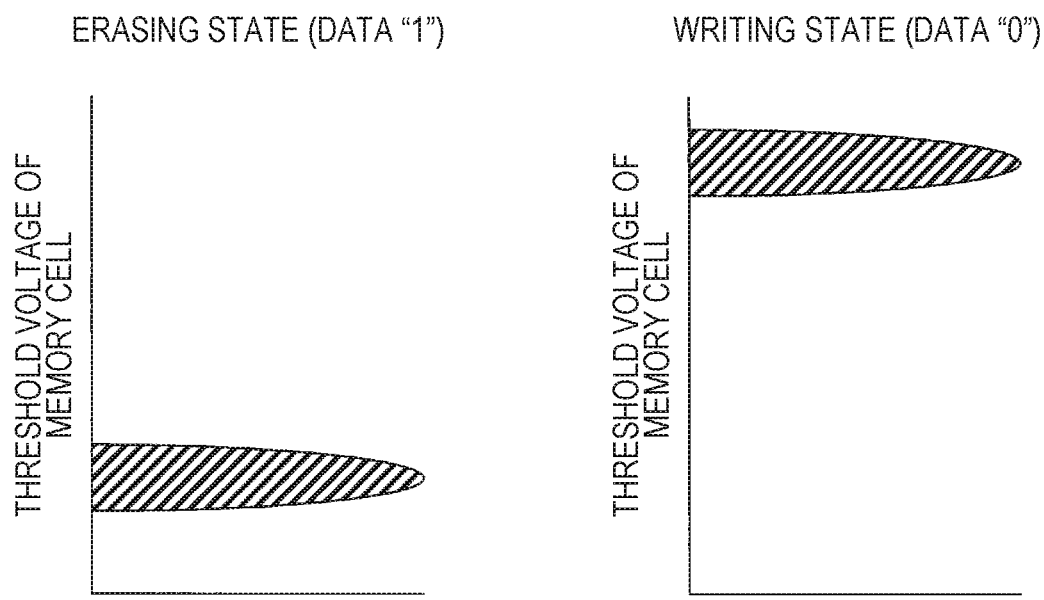
FIG. 8 is a drawing illustrating the outline of the threshold voltage of the memory cell in a write state and an erase state.

FIG. 8 illustrates the outline of the threshold voltage of the memory cell in a write state and an erase state. In the memory cell 140, the threshold voltage of the memory transistor 142 is changed by injecting a charge into the nitride layer 142c. For example, the threshold voltage of the memory transistor 142 in the write state in which an electron has been injected into the nitride layer 142c becomes higher than the threshold voltage in the neutral state in which neither an electron nor a hole exists in the nitride layer 142c, as illustrated in FIG. 8. As compared with this, the threshold voltage of the memory transistor 142 in the erase state in which the hole has been injected into the nitride layer 142c becomes lower than the threshold voltage in the neutral state, as illustrated in FIG. 8.

Figure 9:
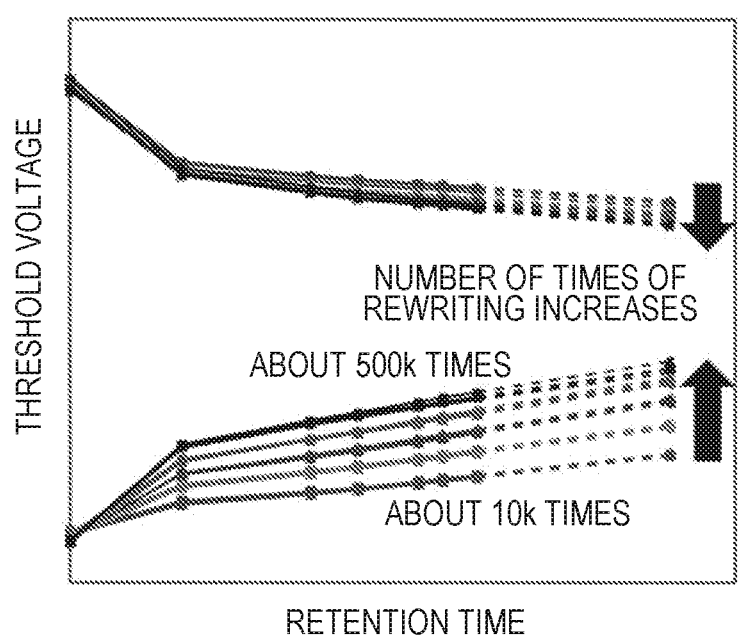
FIG. 9 is a drawing illustrating the outline of data holding characteristics of the flash memory.

FIG. 9 illustrates the outline of data holding characteristics of the flash memory. FIG. 10A and FIG. 10B illustrate the situation of degradation of the data holding characteristics. In the memory cell 140, the threshold voltage is varied as time passes after data is rewritten. For example, in the memory cell 140 in the erase state storing data "1", the threshold voltage rises gradually as time passes after the rewrite of data, as illustrated in FIG. 9. In the memory cell 140 in the write state storing data "0", the threshold voltage falls gradually as time passes after the rewrite of data, as illustrated in FIG. 9. In this way, in the memory cell 140, when time passes after the rewrite of data, the data holding characteristics are degraded.

In the memory cell 140, the data holding characteristics are degraded also by repeating the rewrite of data. Specifically, in the memory cell 140, the rewrite of data is performed by repeating the electron injection by the write operation and the hole injection by the erase operation. However, when the number of times of rewriting increases, the oxide layers 142b and 142d are degraded, and the ability of the nitride layer 142c to trap an electron and a hole is degraded.

When the erase operation is performed according to the above-described BTBTHH method, the degradation of the oxide layer 142b is great, and as illustrated in FIG. 10A, for example, an electron and a hole escape from the nitride layer 142c mainly via the oxide layer 142b. When the erase operation is performed according to the above-described FN tunnel system, the degradation of the oxide layer 142d is great, and as illustrated in FIG. 10B, for example, an electron and a hole escape from, the nitride layer 142c mainly via the oxide layer 142d.

Then, as illustrated in FIG. 9, even if the erase operation is performed, the threshold, voltage in the memory cell 140 to which many number of times of rewriting is performed becomes higher than in the memory cell 140 to which few number of times of rewriting is performed. As illustrated in FIG. 9, even if the write operation is performed, the threshold voltage in the memory cell 140 to which many number of times of rewriting is performed becomes lower than in the memory cell 140 to which few number of times of rewriting is performed. In this way, when the number of times of rewriting increases, the data holding characteristics of the memory cell 140 are degraded.

The degradation of such data holding characteristics is remarkable in the memory cell 140 holding data "1", as illustrated in FIG. 9. The degradation of the data holding characteristics is remarkable particularly when the flash memory 100 is placed under hot environments.

Figure 11:
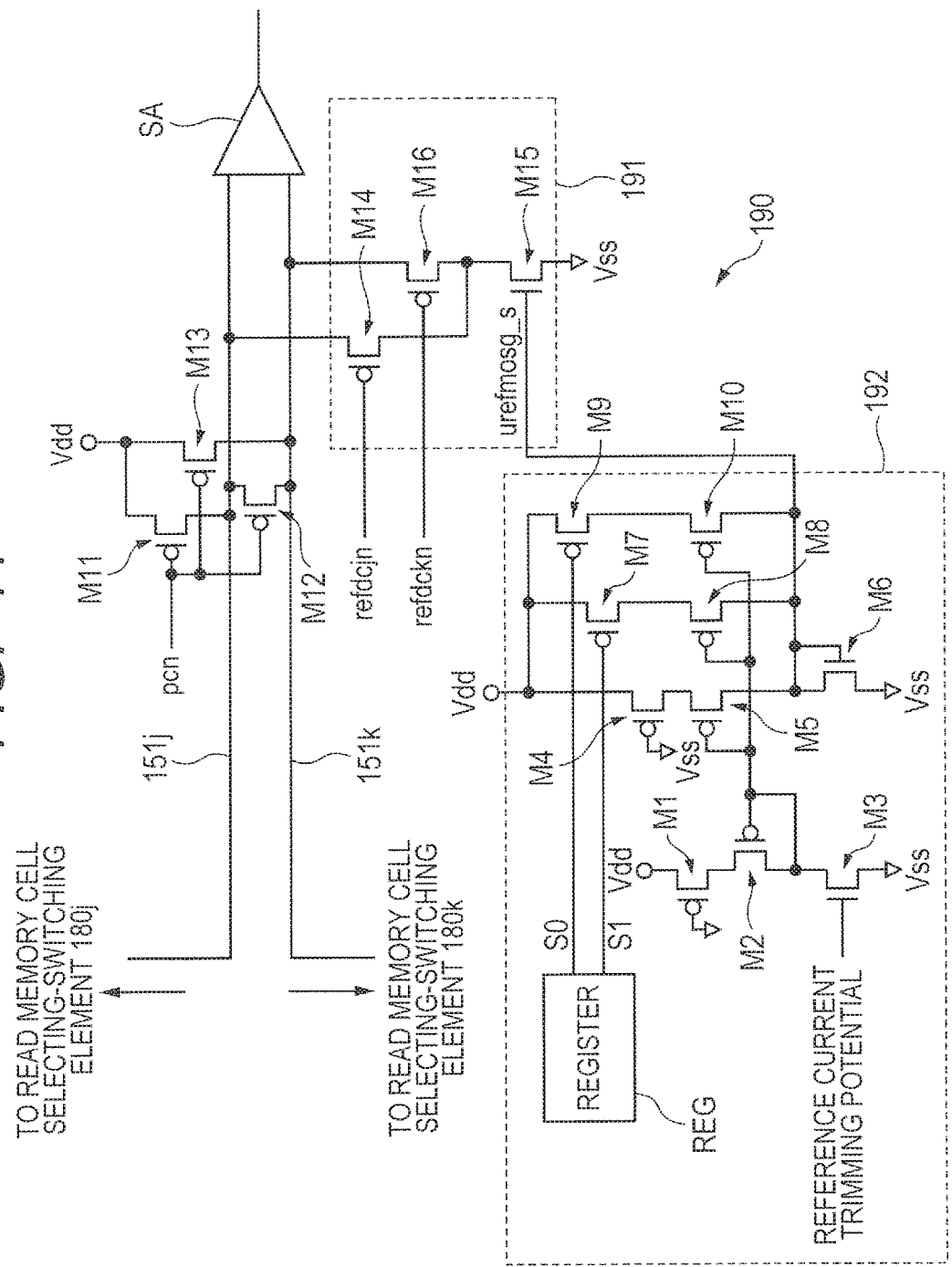
FIG. 11 is a drawing illustrating an example of the circuit configuration of a sense amplifier and the periphery thereof.

FIG. 11 illustrates an example of the circuit configuration of the sense amplifier and the periphery thereof. The sense amplifier SA is coupled, at the input terminals thereof, to a pair of bit lines 151 (151j, 151k) that are coupled to the mutually different memory cells 140. The sense amplifier SA reads data stored in the memory cell 140 as the read target, based on the potential of one of the bit lines 151 (for example, the bit line 151j) and the potential of the other of the bit lines 151 (for example, the bit line 151k), coupled to the memory cell 140 as the read target. For example, the sense amplifier SA reads the data of the memory cell 140 as the read target, based on the difference of the potential of one of the bit lines 151j and the potential of the other of the bit lines 151k.

As illustrated in FIG. 11, MOS transistors (for example, p-channel MOS transistors) M11, M12, and M13 for precharge are coupled to the bit lines 151j and 151k. The bit line 151j is coupled to a high-potential-side power source Vdd via the MOS transistor M11. The bit line 151k is coupled to the high-potential-side power source Vdd via the MOS transistor M13. The bit line 151j and the bit line 151k are mutually coupled via the MOS transistor M12.

When performing the read operation, the bit lines 151j and 151k are precharged via the MOS transistors M11, M12, and M13. Specifically, when a precharge signal pen of a low level is inputted into gate electrodes of the MOS transistors M11, M12, and M13, these MOS transistors M11, M12, and M13 are turned on, and precharge is performed to the bit lines 151*j* and 151*k*.

A bit line potential controller 190 to adjust the potential of the bit line 151 (151*j*, 151*k*) is coupled to the bit line 151 (151*j*, 151*k*). The bit line potential controller 190 includes a potential drawing-out unit 191 and a reference potential generator 192.

The potential drawing-out unit 191 includes MOS transistors M14, M16, and M15. The bit line 151*j* is coupled to a drain of the reference MOS transistor (for example, an n-channel MOS transistor) M15 via the MOS transistor (for example, a p-channel MOS transistor) M14.

The bit line 151*k* is coupled to the drain of the MOS transistor M15 via the MOS transistor (for example, a p-channel MOS transistor) M16. A source of the MOS transistor M15 is coupled to the low-potential-side power source Vss, The operation of the MOS transistor M14 is controlled by a potential drawing-out switching signal refdcjn as illustrated in FIG. 11. The operation of the MOS transistor M16 is controlled by a potential drawing-out switching signal refdckn as illustrated in FIG. 11. The operation of the MOS transistor M15 is controlled by a reference signal urefmosg_s as illustrated in FIG. 11. The reference potential Vref of the reference signal urefmosg_s is specified in the reference potential generator 192 to be described later.

As illustrated in FIG. 11, the reference potential generator 192 includes MOS transistors (for example, p-channel MOS transistors) M1, M2, M4, M5, M7, M8, M9, and M10, MOS transistors (for example, n-channel MOS transistors) M3 and M6, and a register REG.

As illustrated in FIG. 11, the MOS transistors M1, M2, and M3 are couples in series. A source of the MOS transistor M1 is coupled to the high-potential-side power source Vdd, and a source of the MOS transistor M3 is coupled to the low-potential-side power source Vss. A gate electrode of the MOS transistor M2 is coupled to a drain of the MOS transistor M3. A reference current trimming potential is supplied to a gate electrode of the MOS transistor M3. An electric current flowing through the MOS transistors M2 and M3 is specified by the reference current trimming potential; accordingly, a trimming potential Vtrim of a wiring that couples a gate electrode of the MOS transistor M2 and a drain of the MOS transistor M3 is specified.

As illustrated in FIG. 11, the MOS transistors M4 and M5 are coupled in series. The MOS transistors M7 and M8 are coupled in series. The MOS transistors M9 and M10 are coupled in series. A gate electrode of the MOS transistor M4 is coupled to the low-potential-side power source Vss. A reference potential switching signal S1 from the register REG is inputted into a gate electrode of the MOS transistor M7, and a reference potential switching signal S0 from the register REG is inputted into a gate electrode of the MOS transistor M9.

The register REG has a 2-bit configuration corresponding to the MOS transistors M7 and M9, for example. The MOS transistors M7 and M9 are individually turned on and off by the reference potential switching signals S0 and S1 outputted from, the register REG.

Gate electrodes of the MOS transistors M5, M8, and M10 are coupled to the gate electrode and the drain of the MOS transistor M2 and the drain of the MOS transistor M3. Drains of the MOS transistors M5, M8, and M10 are coupled to a drain of the MOS transistor M6. A source of the MOS transistor M6 is coupled to the low-potential-side power source Vss. The drains of the MOS transistors M5, M8, and M10 and the drain of the MOS transistor M6 are coupled to a gate electrode of the MOS transistor M15. The reference potential generator 192 generates the reference potential Vref to be inputted into the gate electrode of the MOS transistor M15, based on the trimming potential Vtrim inputted into the gate electrodes of the MOS transistors M5, M8, and M10, and the reference potential switching signals S0 and S1 outputted from, the register REG.

Figure 13A:
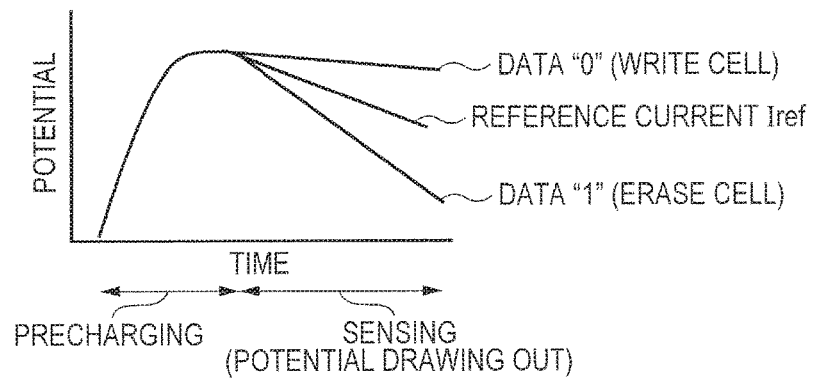
FIG. 13A, FIG. 13B, and FIG. 13C are drawings respectively Illustrating the potential change of a bit line at the time of each read operation.
Figure 13B:
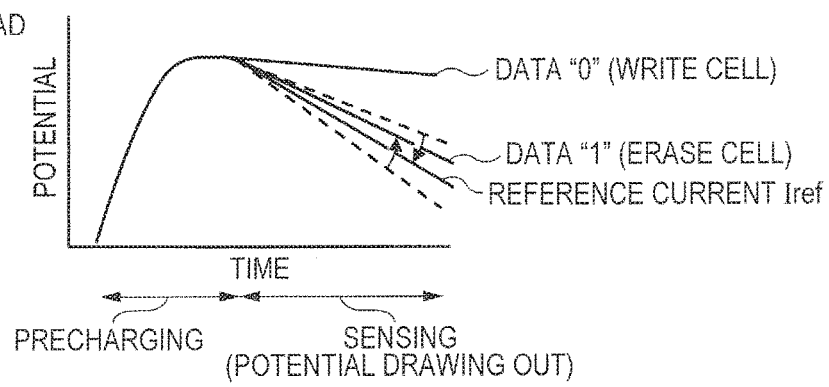
Figure 13C:
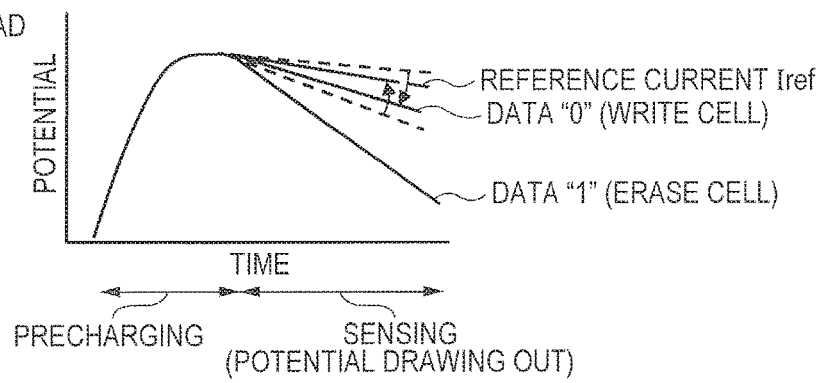

FIG. 12 illustrates a list of register outputs at the time of each read operation according to Embodiment 1 of the present invention. FIG. 13A, FIG. 13B, and FIG. 13C illustrate respectively the potential change of a bit line at the time of each read operation. In the present embodiment, in order to determine whether the refresh operation to be described later is performed, three kinds of read operations called a normal read (the first read operation), a data 1 margin read (the second read operation), and a data 0 margin read (the third read operation) are performed. In the following, the explanation is made assuming that the memory cell 140 coupled to the bit line 151*j* is the read target memory cell. That is, the bit line 151*j* is on the data side, and the bit line 151*k* is on the reference side. Consequently, at the time of the read, operation, in the potential drawing-out unit 191, a signal refdcjn of a high level is inputted into the gate electrode of the MOS transistor M14, and a signal refdckn of a low level is inputted, into the gate electrode of the MOS transistor M16 on the reference side.

<The Normal Read>

The normal read is the operation performed, by the controller 120 in which the memory cell 140 as the read, target is made to draw out the potential of the bit line (one of the bit lines) 151*j*, the bit line potential controller 190 is made to draw out the potential of the bit line (the other of the bit lines) 151*k* at the first speed, and concurrently, the sense amplifier SA is made to read the data.

Specifically, in the normal read, the reference potential switching signal SI from the register REG is set to a low level "L", and the reference potential switching signal S0 is set to a high level "H." At this time, in the reference potential generator 192, the MOS transistors M4 and M7 are turned on, and an electric current (middle current) is supplied from the high-potential-side power source Vdd, via the path of the MOS transistors M4 and M5 and the path of the MOS transistors M7 and M8. The reference potential Vref in the normal read is set at the halfway potential (middle potential) of the reference potential Vref in each of the data 1 margin read and the data 0 margin read to be described later. For example, the reference potential Vref at the time of the normal read is set so that the electric current flowing through the MOS transistors M14 and M16 of the potential drawing-out unit 191 is greater than the electric current flowing through the memory cell 140 that stores data "0", and smaller than the electric current flowing through the memory cell 140 that stores data "1."

In the normal read, the reference current Iref flows through the MOS transistors M16 and M15 from, the bit line 151*k* on the reference side to the low-potential-side power sources Vss. Accordingly, the potential of the bit line 151*k* is gradually drawn out at the predetermined speed (the first speed) and falls, as illustrated in FIG. 13A.

When the memory cell 140 as the read target is in the erase state storing data "1", for example, the threshold voltage of the memory transistor 142 is low as described above. Accordingly, an electric current flows through the memory cell 140 from the bit line 151*j* on the data side toward the source line 153 on the low voltage side. Then, as illustrated in FIG. 13A, the potential of the bit line 151*j* on the data side is drawn out at a speed faster than the speed in the bit line 151k on the reference side, and falls. Consequently, the potential of the bit line 151j on the data side becomes lower than the potential of the bit line 151k on the reference side, and the sense amplifier SA reads data "1" based on the difference of the potential of the bit line 151j and the potential of the bit line 151k.

As opposed to this, when the memory cell 140 is in the write state storing data "0", for example, the threshold voltage of the memory transistor 142 is high. Accordingly, the electric current flowing through the memory cell 140 from the bit line 151j on the data side toward the source line of the low voltage Vss is small as compared with the case of storing data "1." Consequently, the potential of the bit line 151j on the data side becomes higher than the potential of the bit line 151k on the reference side, and the sense amplifier SA reads data "0" from the memory cell 140.

<The Data 1 Margin Read>

The data 1 margin read is the operation performed by the controller 120 in which the memory cell 140 as the read target is made to draw out the potential of the bit line (one of the bit lines) 151j, the bit line potential controller 190 is made to draw out the potential of the bit line (the other of the bit lines) 151k at a second speed faster than the first speed, and concurrently, the sense amplifier SA is made to read the data. The data 1 margin read is performed in order to detect a memory cell 140 of which the data holding characteristics of data "1" has been degraded.

Specifically, in the data 1 margin read, the reference potential switching signals S1 and S0 from the register REG are both set at a low level "L." At this time, in the reference potential generator 192, the MOS transistors M4, M7, and M9 are turned on, and an electric current (high current) is supplied from, the high-potential-side power source Vdd, via the path, of the MOS transistors M4 and M5, the path of the MOS transistors M7 and M8, and the path of the MOS transistors M9 and M10. Consequently, the reference potential Vref in the data 1 margin read is set at the potential (high potential) higher than the reference potential Vref in the normal read. The reference potential Vref in the data 1 margin read is set so that the electric current flowing through the MOS transistors M14 and M16 of the potential drawing-out unit 191 becomes greater than the current in the normal read. For example, the reference potential Vref in the data 1 margin read is set up so that the electric current flowing through the MOS transistors M14 and M16 of the potential drawing-out unit 191 is greater than the electric current flowing through the memory cell 140 storing data "1" of which the degradation of the data holding characteristics has advanced, and smaller than the electric current flowing through the memory cell 140 storing data "1" of which the degradation of the data holding characteristics has not advanced.

In the data 1 margin read, the predetermined reference current Iref greater than the reference current in the normal read flows through the MOS transistor M16, from the bit line 151k toward the low-potential-side power sources Vss. Accordingly, the potential of the bit line 151k is drawn out at a speed (the second speed) faster than the speed in the normal read and falls, as illustrated in FIG. 13B.

When the degradation of the data holding characteristics of the memory cell 140 storing data "1" has advanced and the threshold voltage of the memory transistor 142 has risen, the electric current flowing through the memory cell 140 from the bit line 151j on the data side toward the source line 153 of the low voltage Vss decreases, as compared with the memory cell 140 of which the degradation of the data holding characteristics has not advanced. Therefore, as illustrated in FIG. 13B, the potential of the bit line 151j is drawn out at a speed slower than the speed in the memory cell 140 of which the degradation of the data holding characteristics has not advanced, and falls. Then, the falling speed (the second speed) of the potential of the bit line 151k on the reference side becomes faster than the falling speed of the potential of the bit line 151j on the data side. Consequently, the potential of the bit line 151j becomes higher than the potential of the bit line 151k, and the sense amplifier SA reads data "0" from the memory cell 140 storing data "1".

In this way, in the data 1 margin read, the sense amplifier SA reads wrong data "0" from the memory cell 140 storing data "1"; accordingly, the memory cell 140 of which the degradation of the data holding characteristics of data "1" has advanced is detected.

As compared with this, when the memory cell 140 is in the write state storing data "0", for example, the potential of the bit line 151j does not become lower than the potential of the bit line 151k even when the data 1 margin read is preformed; accordingly, the sense amplifier SA never reads out the wrong data.

<The Data 0 Margin Read>

The data 0 margin read is the operation performed by the controller 120 in which the memory cell 140 as the read target is made to draw out the potential of the bit line (one of the bit lines) 151j, the bit line potential controller 190 is made to draw out the potential of the bit line (the other of the bit lines) 151k at a third speed slower than the first speed, and concurrently, the sense amplifier SA is made to read the data. The data 0 margin read is performed in order to detect, a memory cell 140 of which the data holding characteristics of data "0" has been degraded.

Specifically, in the data 0 margin read, the reference potential switching signals S1 and S0 from the register REG are both set at a nigh level "H." At this time, in the reference potential generator 192, the MOS transistor M4 alone is turned on, and an electric current (high current) is supplied from the high-potential-side power source Vdd, via the path of the MOS transistors M4 and M5. Consequently, the reference potential Vref in the data 0 margin read is set at the potential (low potential) lower than the reference potential Vref in the normal read. The reference potential Vref in the data 0 margin read is set so that the electric current flowing through the MOS transistors M14 and M16 of the potential drawing-out unit 191 becomes smaller than the current in the normal read. For example, the reference potential Vref in the data 0 margin read is set up so that the electric current flowing through the MOS transistors M14 and M16 of the potential drawing-out unit 191 is smaller than the electric current flowing through the memory cell 140 storing data "0" of which the degradation of the data holding characteristics has advanced, and greater than the electric current flowing through the memory cell 140 storing data "0" of which the degradation of the data holding characteristics has not advanced.

In the data 0 margin read, the predetermined reference current. Iref smaller than the reference current in the normal read flows through the MOS transistor M16, from the bit line 151k toward the low-potential-side power sources Vss. Accordingly, the potential of the bit line 151k is drawn out at a speed (the third speed) slower than the speed in the normal read and falls, as illustrated in FIG. 13C.

When the degradation of the data holding characteristics of the memory cell 140 storing data "0" has advanced and the threshold voltage of the memory transistor 142 has fallen, the electric current flowing through the memory cell 140 from the bit line 151*j* on the data side toward the source line 153 of the low voltage Vss increases, as compared with the memory cell 140 of which the degradation of the data holding characteristics has not advanced. Therefore, as illustrated in FIG. 13C, the potential of the bit line 151*j* is drawn out at a speed faster than the speed in the memory cell 140 of which the degradation of the data holding characteristics has not advanced, and falls. Then, the falling speed (the second speed) of the potential of the bit line 151*k* on the reference side becomes slower than the falling speed of the potential of the bit line 151*j* on the data side. Consequently, the potential of the bit line 151*j* becomes lower than the potential of the bit line 151*k*, and the sense amplifier SA reads data "1" from the memory cell 140 storing data "0."

In this way, in the data 0 margin read, the sense amplifier SA reads wrong data "1" from the memory cell 140 storing data "0"; accordingly, the memory cell 140 of which the degradation of the data holding characteristics of data "0" has advanced is detected.

As compared with this, when the memory cell 140 is in the write state storing data "1", for example, the potential of the bit line 151*j* does not become higher than the potential of the bit line 151*k* even when the data 0 margin read is preformed; accordingly, the sense amplifier SA never reads out the wrong data.

<A Refreshing Method of the Flash Memory>

Figure 14:
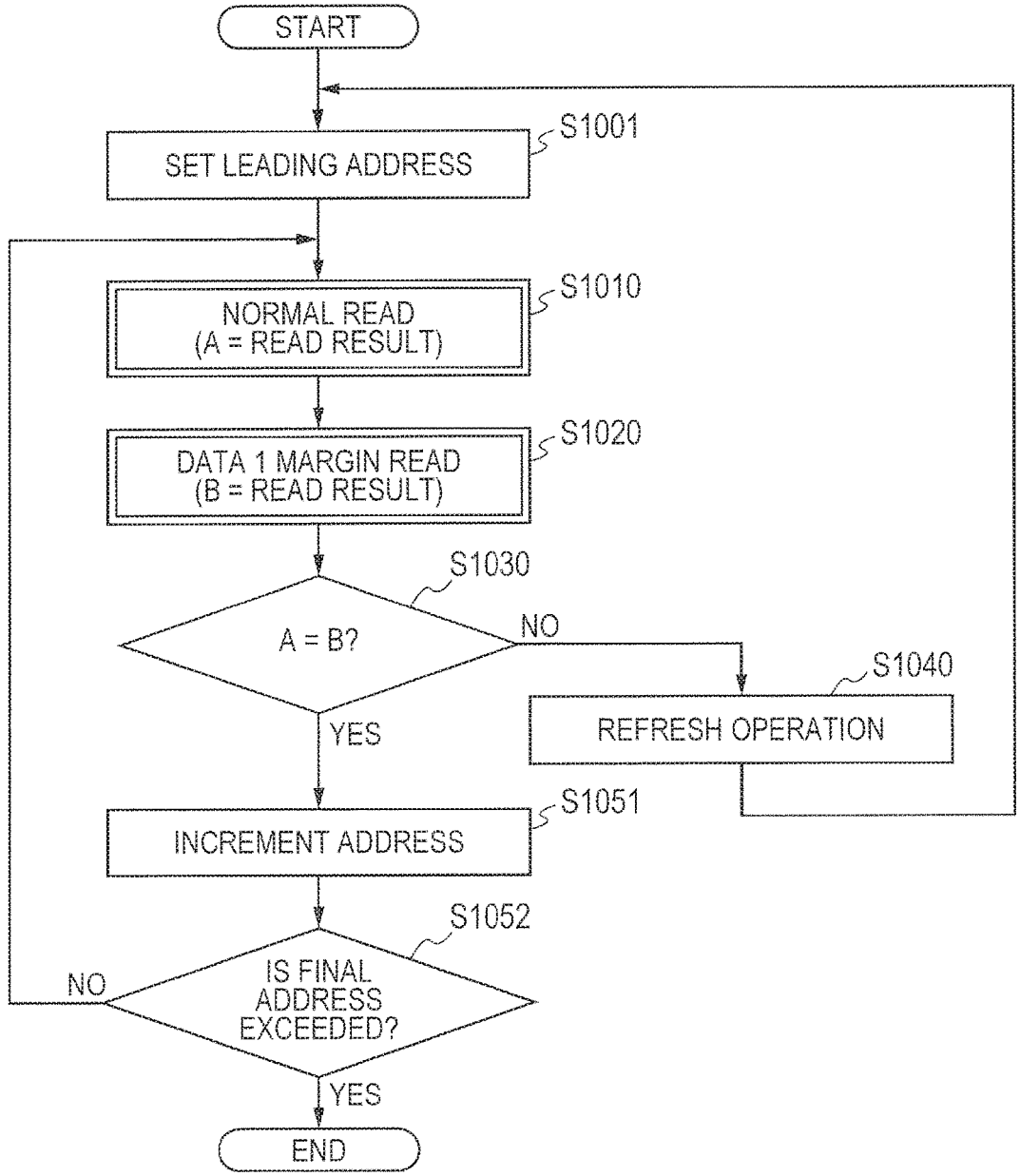
FIG. 14 is a flow chart illustrating a refreshing method of a flash memory according to Embodiment 1 of the present invention.

Next, a refreshing method of the flash memory 100 is explained. In the present embodiment, a series of processing regarding the refresh operation is performed by detecting the memory cell 140 storing data "1" of which the degradation of the data holding characteristics is significant. FIG. 14 is a flow chart illustrating the refreshing method of the flash memory according to Embodiment 1 of the present invention. In the present embodiment, as illustrated in FIG. 14, the refresh operation of the flash memory is performed by Step S1001 to Step S1052.

The refresh operation is performed at the time of power-on, restart, power-off of the micro controller 300, or in accordance with user's instructions.

At first, at Step S1001, the leading address when performing the normal read and the data 1 margin read to be described later is set up. The leading address may be the leading address of the address space of the nonvolatile memory or may be the leading address of an erasing unit. For example, the controller 120 illustrated in FIG. 3 sets the leading address of the flash memory 100 illustrated in FIG. 2 as the leading address at the time of performing the read operation. The controller 120 outputs the set leading address to the read system row selector 101 illustrated in FIG. 3, for example. The read system row selector 101 selects the word line 152 based on the leading address inputted from the controller 120, and selects the memory cell 140 coupled to the selected word line 152 as the memory cell 140 as the read target.

Step S1010 is a first read step at which the controller 120 performs the normal read. Specifically, the sense amplifier SA performs the normal read to the memory cell 140 as the read target, selected at Step S1001. The sense amplifier SA outputs the read data to the output buffer 109 illustrated in FIG. 3, and the output buffer 109 amplifies the data inputted from the sense amplifier SA, and outputs the amplified data to the controller 120. The controller 120 instructs the data holding unit (not shown) to hold the data that is inputted from the output buffer 109. Alternatively, the controller 120 may output the data inputted from the output buffer 109 to the RAM 304 via the high-speed bus 311 illustrated in FIG. 3, and may instruct the RAM 304 to hold the data.

Step S1020 is a second read step at which the controller 120 performs the data 1 margin read. Specifically, the sense amplifier SA performs the data 1 margin read to the memory cell 140 to which the normal read has been performed at the immediately preceding step S1010. The sense amplifier SA outputs the read data to the output buffer 109, and the output buffer 109 amplifies the data inputted from the sense amplifier SA, and outputs the amplified data to the controller 120. The controller 120 instructs the data holding unit (not shown) to hold the data that is inputted from the output buffer 109. Alternatively, the controller 120 may output the data inputted from the output buffer 109 to the RAM 304 via the high-speed bus 311, and may instruct the RAM 304 to hold the data.

Step S1030 is a first data comparison step (the first data comparison operation) in which the controller 120 compares the data read at the first read step S1010 with the data read at the second read step S1020. Specifically, the controller 120 compares the data read at the first read step S1010 and held in the data holding unit (not shown) with the data read at the second read step S1020. Alternatively, the controller 120 reads and compares the data read at the first read step S1010 and held in the RAM 304 and the data read at the second read step S1020 and held in the RAM 304. The controller 120 compares these pieces of data to detect the memory cell 140 of which the degradation of the data holding characteristics of data "1" has advanced.

At Step S1030, when the controller 120 determines that the data read at the first read step S1010 and the data read at the second read step S1020 are different from each other (No), Step S1040 is performed.

Step S1040 is a first refresh step in which the controller 120 performs the first refresh operation by rewriting the data stored in the memory cell 140 as the read target to the memory cell 140 as the read target. For example, the controller 120 outputs the data read by the normal read to the IO circuit/power control circuit/register 103 illustrated in FIG. 3, as the write data. The IO circuit/power control circuit/register 103 outputs the inputted write data to the write latch 107 for example, to hold it.

The controller 120 outputs, to the rewrite system row selector 110 illustrated in FIG. 3, the memory gate selecting signal to select the memory gate line 154 that is coupled to the memory cell 140 to which the data 1 margin read has been performed at the immediately preceding step S1020. The rewrite system row selector 110 selects the memory gate line 154 coupled to the memory cell 140 to which the data 1 margin read has been performed, that is, the memory cell 140 to which the refresh operation is to be performed, based on the inputted memory gate selecting signal. Then, the controller 120 applies the potential for the write operation illustrated in FIG. 7A and FIG. 7B to each part of the memory cell 140 to which the refresh operation is to be performed. Then, the write latch 107 outputs the write data held to the common bit line 150, based on a signal outputted from the input clocked inverter 102, for example. The write data outputted to the common bit line 150 is inputted and written in the memory cell 140 via the bit line selecting-switching element 170 and the bit line 151. In this way, the refresh operation is performed every word line 152 arranged in the row direction in the memory array 108, for example.

When the first refresh operation has been performed, the flow shifts to Step S1001, and the detection of the memory cell 140 of which the degradation of the data holding characteristics has advanced is performed again from the leading address. The leading address may be the leading address of the address space of the nonvolatile memory or may be the leading address of an erasing unit. That is, after performing the first refresh operation, the controller 120 performs to the memory cell 140 as the read target, the first read step S1010 (the first read operation), the second read step S1020 (the second read operation), and the first data comparison step S1030 (the first data comparison operation).

At step S1030, when the controller 120 determines that the data read at the first read step S1010 and the data read at the second read step S1020 are the same (Yes), Step S1051 is performed.

At step S1051, the address is incremented. Specifically, the controller 120 sets up the new address for selecting the memory cell 140 as the next read target.

At Step S1052, it is determined whether the new address set up at Step S1051 has exceeded the final address. For example, the controller 120 compares the address set up at Step S1051 with the final address of the flash memory 100 illustrated in FIG. 2. When it is determined that the address set up at Step S1051 does not exceed the final address of the flash memory 100 illustrated in FIG. 2 for example, but is the address within the flash memory 100 (No), the flow shifts to Step S1010. Then, to the memory cell 140 as the read target selected by the new address, the detection and the refresh operation of the memory cell 140 of which the degradation of the data holding characteristics has advanced are performed. These processing is performed to all the memory cells 140 of the memory array 108, and the detection and the refresh operation of the memory cell 140 of which the degradation of the data holding characteristics has advanced are performed.

As compared with this, when the controller 120 determines that the address set up at. Step S1051 exceeds the final address of the flash memory 100 illustrated in FIG. 2, and becomes the address of the other memory than the flash memory 100 (Yes), it is determined that the detection and the refresh operation of the memory cell 140 of which the degradation of the data holding characteristics has advanced has been performed to all the memory cells 140, and the series of processing regarding to the refresh operation is finished.

<The Effect by the Present Embodiment>

According to the present embodiment, the controller 120 performs the normal read (the first, read operation, the first read step S1010) and the data 1 margin read (the second read operation, the second, read step S1020) to the memory cell 140 as the read target, and compares the data read by the normal read and the data read by the data 1 margin read (the first data comparison operation, the first data comparison step S1030). When it is determined that the data read by the normal read and the data read by the data 1 margin read is different, the controller 120 performs the first refresh operation (the first refresh step S1040).

According to this configuration, it is possible to detect the memory cell 140 of which the degradation of the data holding characteristics of data "1" has advanced, by performing the data 1 margin read with the read conditions of data "1" severer than the normal read. Accordingly, the refresh operation can be performed at the appropriate time before a read error occurs. In addition, according to the present configuration, the reliability of the flash memory 100 enhances and the reliability of the micro controller 300 that mounts the flash memory 100 enhances.

Moreover, according to this configuration, the detection of the memory cell 140 of which the degradation of the data holding characteristics has advanced is performed, specializing to data "1" with greater degradation of the data holding characteristics than data "0." Accordingly, it is possible to reduce the time necessary for the refresh.

Furthermore, according to the present embodiment, the flash memory includes the memory array 108 having multiple memory mats mat in which the memory cells 140 are arranged in a matrix. The bit lines 151 are provided for every memory mat mat, and each of the bit line 151 (151*j*, 151*k*) is coupled to the common bit line 150 common to the multiple memory mats mat, via the bit line selecting-switching element 170 (170*j*, 170*k*).

According to this configuration, it is possible to shorten the bit line 151 (151*j*, 151*k*) coupled to the sense amplifier SA. Accordingly, the wiring load at the time of the read operation is reduced. Accordingly, the drawing out time of the potential from the bit line 151 (151*j*, 151*k*) is shortened, and the reading time of the data by means of the sense amplifier SA is shortened. Accordingly, the time required for the refresh operation is shortened.

Moreover, according to the present embodiment, in the memory mat mat, multiple memory cells 140 are arranged in a matrix in the row direction (the first direction) and the column direction (the second direction). The bit line 151 (151*j*, 151) is provided for every memory cells 140 for one line arranged in the column direction, and each bit line 151 (151*j*, 151*k*) is coupled to the input terminal of the sense amplifier SA via the read memory cell selecting-switching element 180 (180*j*, 180*k*).

According to this configuration, plural bit lines 151 (151*j*, 151*k*) share the sense amplifier SA. Accordingly, the sense amplifier SA is reduced in number and the wiring structure around the sense amplifier SA is simplified. Accordingly, increase of the chip area of the flash memory 100 is suppressed.

Moreover, according to the present embodiment, the sense amplifier SA is provided for every pair of memory mats matj and matk, and the bit line 151 (151*j*, 151*k*) of each memory mat is coupled to the input terminal of the sense amplifier SA.

According to this configuration, the input terminal of the sense amplifier SA is coupled to the bit line 151 (for example, the bit line 151*k*) of the memory mat matj to which a non-read-target memory cell 140 belongs. Accordingly, the control on the reference side at the time of read is simplified and the load of each circuit including the controller 120 is reduced.

Moreover, according to this configuration, the variations in the wire length to the sense amplifier SA are suppressed, and the variations in wiring load for every bit line 151 (151*j*, 151*k*) are suppressed. Accordingly, occurrence of the read error of the data due to the variations in wiring load is suppressed. Accordingly, the reliability of the flash memory 100 is enhanced.

Moreover, according to the present embodiment, the memory cells for one line arranged in the column direction (the second direction) in each memory mat mat (matj, matk) are same in number.

According to this configuration, the length of each bit line 151 (151*j*, 151*k*) becomes almost equal. Accordingly, the variations in wiring load for every bit line 151 (151*j*, 151*k*) are suppressed. Accordingly, occurrence of the read error of the data due to the variations in wiring load is suppressed. Moreover, the reliability of the flash memory 100 is enhanced.

Moreover, according to the present embodiment, the controller 120 performs the first refresh operation every word line 152.

According to this configuration, the number of the memory cells 140 to which the refresh operation is performed at a time is reduced. Accordingly, the time required for the first refresh operation is shortened. Moreover, according to this configuration, no refresh operation is performed if the memory cell 140 of which the degradation of the data holding characteristics has advanced is not coupled to one word line 152. Accordingly, the power consumption for the refresh operation is reduced.

Moreover, according to the present embodiment, after performing the first refresh operation in the first refresh step S1040, the controller 120 performs the first read step S1010, the second read step S1020, and the first data comparison step S1030, to the memory cell 140 as the read target.

According to this configuration, the memory cell 140 to which the refresh operation has been performed is reconfirmed about whether the degradation of the data holding characteristics has advanced. Accordingly, the reliability of the flash memory 100 is enhanced, and the reliability of the micro controller 300 that mounts the flash memory 100 is enhanced.

Embodiment 2

Next, Embodiment 2 of the present invention is explained. The present embodiment explains the processing related to the refresh operation in which the data 0 margin read is also performed in addition to the data 1 margin read. In the following, the explanation about the contents overlapping with Embodiment 1 described above is omitted in principle.

Figure 15:
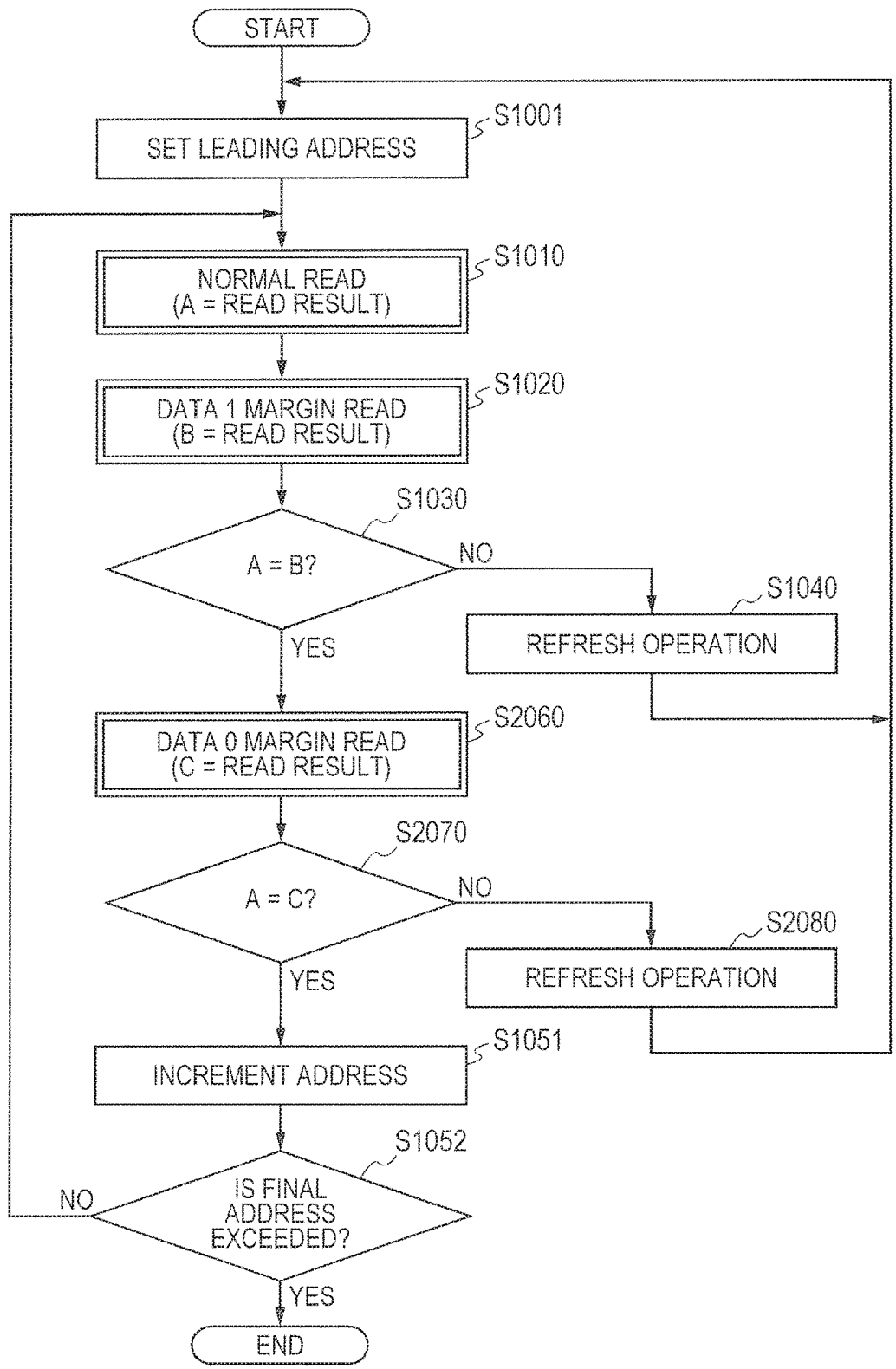
FIG. 15 is a flow chart illustrating a refreshing method of a flash memory according to Embodiment 2 of the present invention.

FIG. 15 is a flow chart illustrating a refreshing method of a flash memory according to Embodiment 2 of the present invention. In the present embodiment, as illustrated in FIG. 15, the refresh operation of the flash memory is performed by Step S1001 to Step S1052, and Step S2060 to Step S2080.

At Step S1030, when the controller 120 determines that the data read at the first read step S1010 and the data read at the second read step S1020 are the same (Yes), Step S2060 is performed.

Step S2060 is a third read step at which the controller 120 performs the data 0 margin read. Specifically, the sense amplifier SA performs the data 0 margin read to the memory cell 140 to which the read operation has been performed at Step S1010 and Step S1020. The sense amplifier SA outputs the read data to the output buffer 109, and the output buffer 109 amplifies the data inputted from the sense amplifier SA, and outputs the amplified data to the controller 120. The controller 120 instructs the data holding unit (not shown) to hold the data that is inputted from the output buffer 109. Alternatively, the controller 120 may output the data inputted from the output buffer to the RAM 304 via the high-speed bus 311, and may instruct the RAM 304 to hold the data.

Step S2070 is a second data comparison step (the second data comparison operation) in which the controller 120 compares the data read at the first read step S1010 with the data read at the third read step S2060. Specifically, the controller 120 compares the data read at the third read step S2060 with the data read at the first read step S1010 and held in a data holding unit (not shown). Alternatively, the controller 120 reads and compares the data read at the first read step S1010 and held in the RAM 304 and the data read at the third read step S2060 and held in the RAM 304. The controller 120 detects the memory cell 140 of which the degradation of the data holding characteristics of data "0" has advanced by comparing these pieces of data.

At Step S2070, when the controller 120 determines that the data read at the first read step S1010 and the data read at the third read step S2060 are different from each other (No), Step S2080 is performed. Step S2080 is the first refresh step. At Step S2080, the controller 120 performs the same processing as at the first refresh step S1040 described above; accordingly, the detailed explanation thereof is omitted.

When the first refresh operation is performed, the flow shifts to Step S1001, and the detection of the memory cell 140 of which the degradation of the data holding characteristics has advanced is performed again from the leading address. The leading address may be the leading address of the address space of the nonvolatile memory or may be the leading address of an erasing unit. That is, after performing the refresh operation, the controller 120 performs, to the memory cell 140 as the read target, the first read step S1010 (the first read operation), the second read step S1020 (the second read operation), the first data comparison step S1030 (the first data comparison operation), the third read step S2060 (the third read operation), and the second data comparison step S2070 (the second data comparison operation).

At Step S2070, when the controller 120 determines that the data read at the first read step S1010 and the data read at the third read step S2060 are the same (Yes), Step S1051 and Step S1052 are performed sequentially. The processing at Step S1051 and Step S1052 is already explained; accordingly, the detailed explanation thereof is omitted.

<The Effect by the Present Embodiment>

According to the present embodiment, in addition to the effect in the above-described embodiment, the following effects are obtained.

According to the present embodiment, when the controller 120 determines, in the first data comparison operation (the first data comparison step S1030), that the data read by the normal read (the first read operation, the first read step S1010) and the data read by the data 1 margin read (the second read operation, the second read step S1020) are the same, the controller 120 performs the data 0 margin read (the third read operation, the third read step S2060) to the memory cell 140 as the read target. Then, when the controller 120 compares the data read by the normal read with the data read by the data 0margin read (the second data comparison step S2070), and determines that the data read by the normal read and the data read by the data 0 margin read are different from each other, the controller 120 performs the first refresh operation (the first refresh step S2080).

According to this configuration, the controller 120 performs the data 1 margin read, and then performs the data 0margin read also. Accordingly, it is possible to enhance the accuracy of detecting the memory cell 140 of which the degradation of the data holding characteristics has advanced. Accordingly, the reliability of the flash memory 100 enhances and the reliability of the micro controller 300 that mounts the flash memory 100 enhances.

Furthermore, according to the present embodiment, after performing the first refresh operation (the first refresh step S2080), the controller 120 performs to the memory cell 140 as the read target to which the first refresh operation has been performed, the normal read (the first read operation, the first read step S1010), the data 1 margin read (the second read operation, the second read step S1020), the first data comparison operation (the first data comparison step S1030), the data 0 margin read (the third read operation, the third read step S2060), and the second data comparison operation (the second data comparison step S2070).

According to this configuration, also when the data 0margin read is performed, it is reconfirmed whether the degradation of the data holding characteristics has advanced, to the memory cell 140 to which the first refresh operation has been performed. Accordingly, the reliability of the flash memory 100 is further enhanced, and the reliability of the micro controller 300 that mounts the flash memory 100 is further enhanced.

Embodiment 3

Next, Embodiment 3 of the present invention is explained. The present embodiment explains a flash memory of a complementary system in which data is stored in a pair of memory cells. In the following, the explanation about the contents overlapping with Embodiment 1 and Embodiment 2 described above is omitted in principle.

<The Configuration of the Flash Memory>

Figure 16:
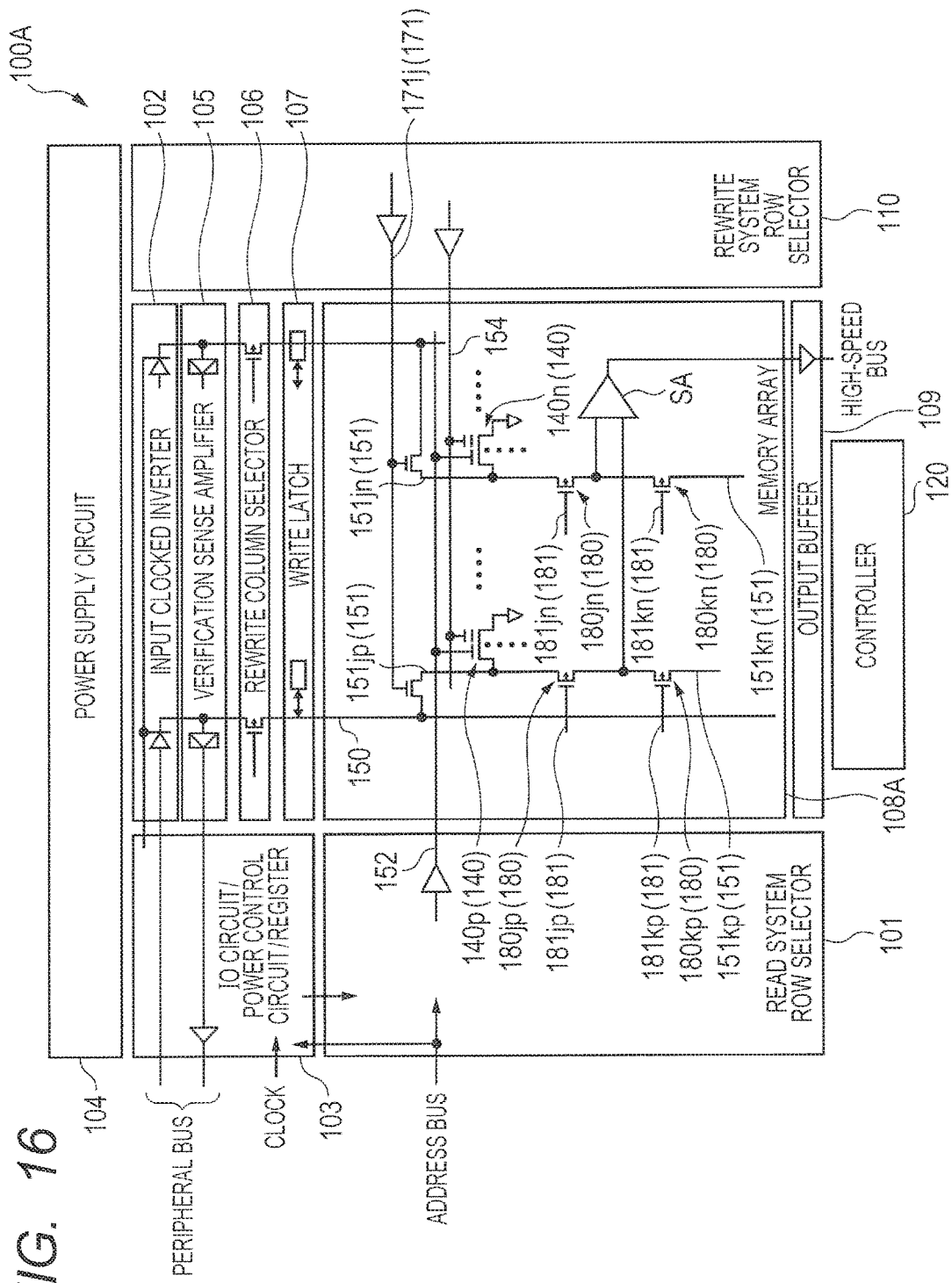
FIG. 16 is a drawing illustrating an example of the configuration of a flash memory according to Embodiment 3 of the present invention.
Figure 17:
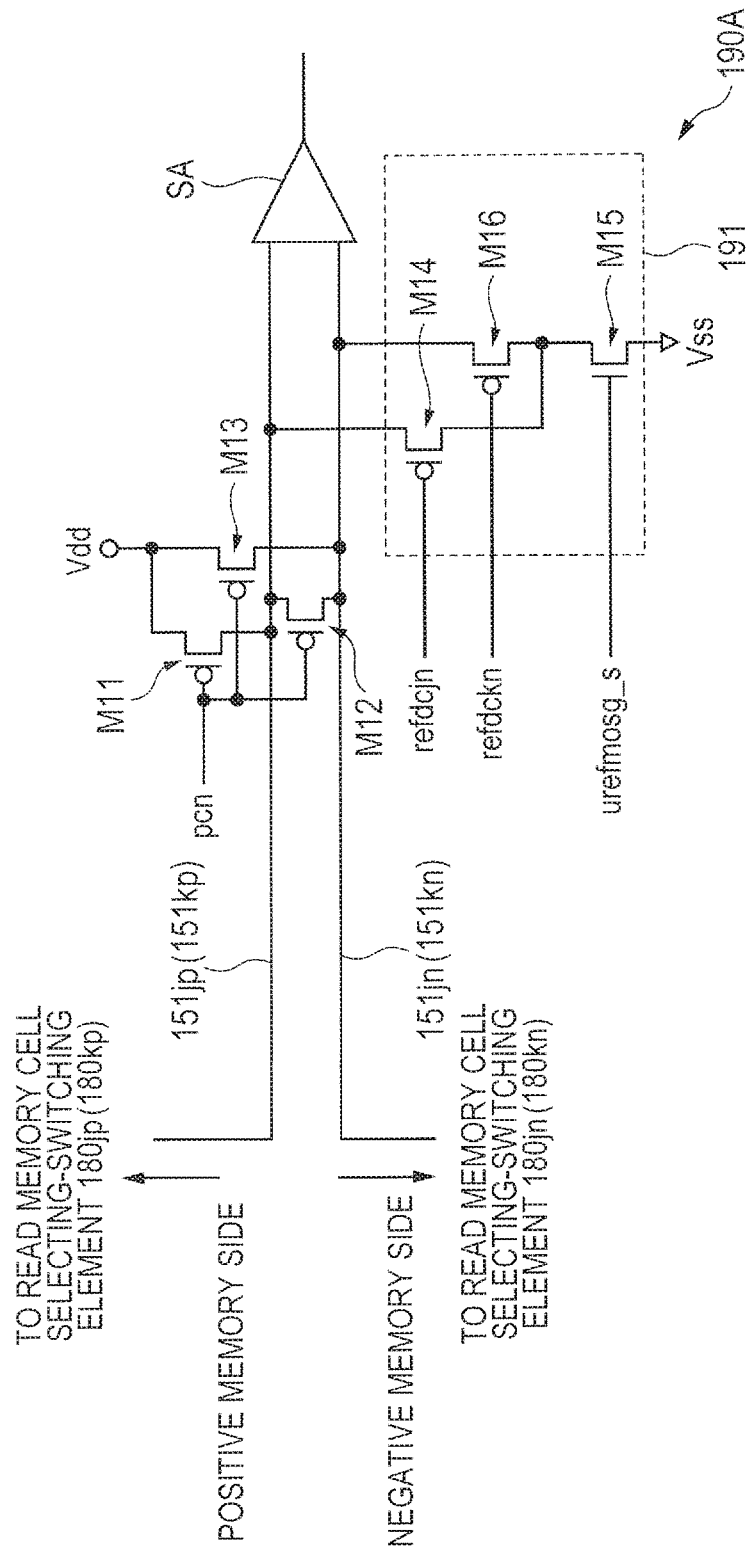
FIG. 17 is a drawing illustrating an example of the circuit configuration of a sense amplifier and the periphery thereof.

FIG. 16 illustrates an example of the configuration of the flash memory according to Embodiment 3 of the present invention. FIG. 17 illustrates an example of the circuit configuration of a sense amplifier and the periphery thereof. As illustrated in FIG. 16, the flash memory 100A is typically comprised of a read system, row selector 101, an input clocked inverter 102, an IO circuit/power control circuit/register 103, a power supply circuit 104, a verification sense amplifier 105, a rewrite column selector 106, a write latch 107, a memory array 108A, an output buffer 109, a rewrite system row selector 110, and a controller 120.

In the flash, memory 100A of the complementary system, data is stored by a pair of memory cells 140 (140$p$, 140$n$) illustrated in FIG. 16. Specifically, the data is stored in one of the memory cells 140$p$ and the inverted data obtained by inverting the data in the other of the memory cells 140$n$. In the following, the memory cell 140$p$ to store the data is also called a positive memory, and the memory cell 140$n$ to store the inverted data is called a negative memory.

In the memory array 108A, the sense amplifier SA is provided for every pair of memory mats mat, as illustrated in FIG. 4, for example. A bit line 151 (for example, 151$jp$, 151$jn$, 151$kp$, 151$kn$) of each memory mat mat is coupled to the input terminal of the sense amplifier SA via the read memory cell selecting-switching element 180 (180$jp$, 180$jn$, 180$kp$, 180$kn$), as illustrated in FIG. 16 and FIG. 17. The read memory cell selecting-switching element 180 (180$ip$, 180$jn$, 180$kp$, 180$kn$) is comprised of a MOS transistors, for example. Each gate of the read memory cell selecting-switching element 180 (180$jp$, 180$jn$, 180$kp$, 180$kn$) is coupled respectively to the memory cell selecting line 181 (181$jp$, 181$jn$, 181$kp$, 181$kn$). The memory cell selecting line 181 (181$jp$, 181$jn$, 181$kp$, and 181$kn$) is coupled to the read system row selector 101, for example.

The sense amplifier SA is coupled, at an input terminal, to a pair of bit lines coupled to the pair of the memory cells 140 (140$p$, 140$n$). The pair of the memory cells 140 (140$p$, 140$n$) are comprised of two memory cells 140 provided on the same word line 152, as illustrated in FIG. 16 for example. That is, the pair of the memory cells 140 (140$p$, 140$n$) are provided for example in the same memory mat mat, and at the time of the read operation, the bit lines 151$jp$ and 151$jn$ (or the bit lines 151$kp$ and 151$kn$) are coupled to the input terminals of the sense amplifier SA as the pair of bit lines, respectively. The sense amplifier SA reads the data stored in the pair of memory cells 140 (140$p$, 140$n$), based on the potential of the bit line (one of the bit lines) 151$jp$ coupled to the memory cell (one of the memory cells) 140$p$ and the potential of the bit line (the other of the bit lines) 151$jn$ coupled to the memory cell (the other of the memory cells) 140$n$.

The bit line potential controller 190A includes a potential drawing-out unit 191. In the bit line potential controller 190A, the reference potential generator 192 illustrated in FIG. 11 is not provided. Therefore, as illustrated in FIG. 17, a reference signal urefmosg_s set at a predetermined potential is inputted into the gate electrode of the MOS transistor M15.

In the flash memory of the complementary system, the reason why the reference potential generator 192 is not provided in the bit line potential controller 190 is as follows. It is because, in the complementary system, the memory cell 140 (140$p$, 140$n$) is coupled to each input terminal of the sense amplifier SA, and data can be read by making the memory cell 140 (140$p$, 140$n$) draw out the potential of the bit lines 151$jp$ (151$kp$) and 151$jn$ (151$kn$).

Figure 18A:
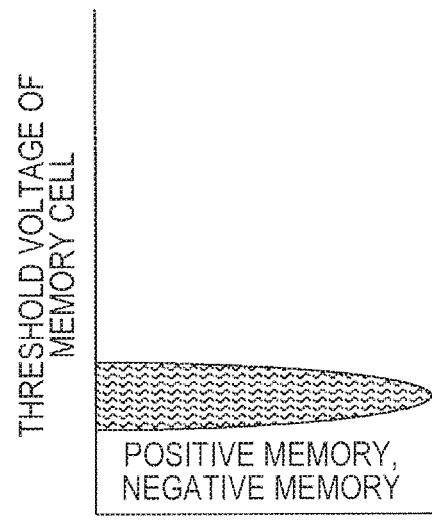
FIG. 18A, FIG. 18B, and FIG. 18C are drawings respectively illustrating the outline of the threshold voltage of the memory cell in an initialization state and a write state.
Figure 18B:
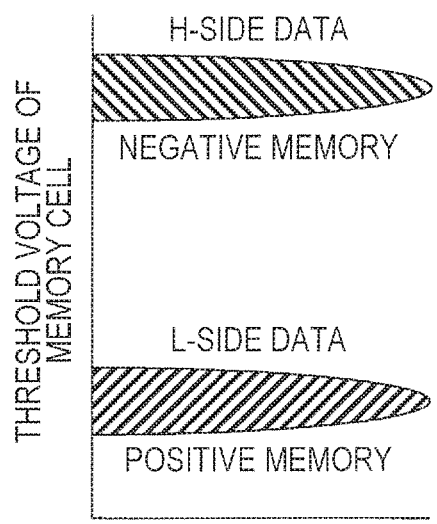
Figure 18C:
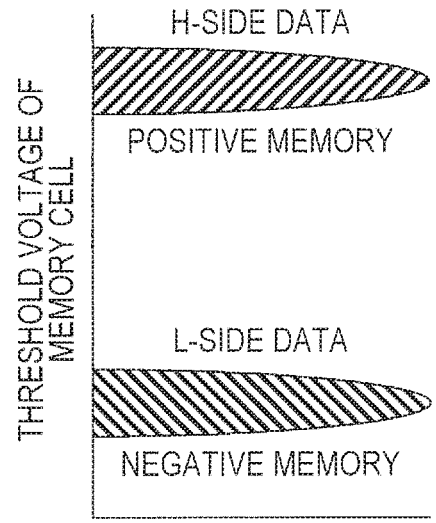

FIG. 18A, FIG. 18B, and FIG. 18C illustrate respectively the outline of the threshold voltage of the memory cell in an initialization state and a write state. In the initialization state before the write operation is performed, as illustrated in FIG. 18A, threshold voltages of the positive memory 140$p$ and the negative memory 140$n$ are both lower than the threshold voltage in a neutral state.

When data "1" is written in, the write operation is performed only to the negative memory 140$n$. Therefore, the threshold voltage of the positive memory 140$p$ is lower than the threshold voltage in the neutral state, as illustrated in FIG. 18B. On the other hand, the threshold voltage of the negative memory 140$n$ is higher than the threshold voltage in the neutral state, as illustrated in FIG. 18B.

On the other hand, when data "0" is written, the write operation is performed only to the positive memory 140$p$. Therefore, the threshold voltage of the positive memory 140$p$ is higher than the threshold voltage in the neutral state, as illustrated in FIG. 18C. On the other hand, the threshold voltage of the negative memory 140$n$ is lower than the threshold voltage in the neutral state, as illustrated in FIG. 18C.

In this way, as illustrated in FIG. 18B and FIG. 18C, in the complementary system, the memory cell 140 with the threshold voltage lower than the neutral state stores the "L" side data and the memory cell 140 with the threshold voltage higher than the neutral state stores the "H" side data. That is, when data "1" is stored, the positive memory 140$p$ stores the "L" side data, and the negative memory 140$n$ stores the "H" side data. On the other hand, when data "0" is stored, the positive memory 140$p$ stores the "H" side data, and the negative memory 140$n$ stores the "L" side data.

"L" here means the state where the threshold voltage of the memory cell 140 is lower than the neutral state, and the "L" side data means the data stored in the memory cell 140 of which the threshold voltage is lower than the neutral state. "H" here means the state where the threshold voltage of the memory cell 140 is higher than the neutral state, and the "H" side data means the data stored in the memory cell 140 of which the threshold voltage is higher than the neutral state.

Next, the read operation in the present embodiment is explained. FIG. 19 illustrates the list of the potential applied to the potential drawing-out unit at the time of each read operation according to Embodiment 3 of the present invention.

In the present embodiment, in order to determine whether the refresh operation to be described later is performed, three kinds of read operations of the normal read (the fourth read operation), the data 1 margin read (the fifth read operation), and the data 0 margin read (the sixth read operation) are performed.

<The Normal Read>

In the normal read, to a pair of the memory cells 140 as the read target, the controller 120 performs the operation in which the memory cell (one of the memory cells) 140*p* is made to draw out the potential of the bit line (one of the bit lines) 151*jp* (151*kp*), the memory cell (the other of the memory cells) 140*n* is made to draw out the potential of the bit line (the other of the bit lines) 151*jn* (151*kn*), and concurrently, the sense amplifier SA is made to read the data. Therefore, in the potential drawing-out unit 191 at the time of the normal read, as illustrated in FIG. 19, signals refdcjn and refdckn of a high level are inputted respectively into the gate electrodes of the MOS transistors M14 and M16.

When a pair of the memory cells 140 as the read target store data "1", for example, the positive memory 140*p* stores the "L" side data, and the negative memory 140*n* stores the "H" side data. At this time, the threshold voltage is low in the positive memory 140*p*. Accordingly, an electric current flows through the memory cell 140 from, the bit line 151*jp* (151*kp*) toward the source line 153 on the low voltage side. Then, the potential of the bit line 151*jp* (151*kp*) is drawn out and falls. On the other hand, in the negative memory 140*n*, the threshold voltage is high. Accordingly, an electric current flowing from the bit line 151*jn* (151*kn*) toward the source line 153 is small as compared with the positive memory 140*p*. Accordingly, the potential of the bit line 151*jn* (151*kn*) is not drawn out and does not fall more than the potential of the bit line 151*jp* (151*kp*). Consequently, the potential of the bit line 151*jp* (151*kp*) becomes lower than the potential of the bit line 151*jn* (151*kn*), and the sense amplifier SA reads data "1", based on the difference of the potential of the bit line 151*jp* (151*kp*) and the potential of the bit line 151*jn* (151*kn*).

On the other hand, when a pair of memory cells 140 as the read target stores data "0", for example, the positive memory 140*p* stores the "H" side data, and the negative memory 140*n* stores the "L" side data. At this time, the threshold voltage is low in the negative memory 140*n*. Accordingly, an electric current flows through the memory cell 140 from the bit line 151*jn* (151*kn*) toward the source line 153 on the low voltage side. Then, the potential of the bit line 151*jn* (151*kn*) is drawn out and falls. On the other hand, in the positive memory 140*p*, the threshold voltage is high. Accordingly, the electric current flowing from the bit line 151*jp* (151*kp*) toward the source line 153 is small as compared with the negative memory 140*n*. Accordingly, the potential of the bit line 151*jp* (151*kp*) is not drawn out and does not fall more than the potential of the bit line 151*jn* (151*kn*). Consequently, the potential of the bit line 151*jp* (151*kp*) becomes higher than the potential of the bit line 151*jn* (151*kn*), and the sense amplifier SA reads data "0", based on the difference of the potential of the bit line 151*jp* (151*kp*) and the potential of the bit line 151*jn* (151*kn*).

<The Data 1 Margin Read>

In the data 1 margin read, to a pair of the memory cells 140 as the read target, the controller 120 performs the operation in which the memory cell (one of the memory cells) 140*p* is made to draw out the potential of the bit line (one of the bit lines) 151*jp* (151*kp*), the memory cell (the other of the memory cells) 140*n* and the bit line potential controller 190 are made to draw out the potential of the bit line (the other of the bit lines) 151*jn* (151*kn*), and concurrently, the sense amplifier SA is made to read the data. Therefore, in the potential drawing-out unit 191 at the time of the data 1 margin read, as illustrated in FIG. 19, the signal refdcjn of a high level is inputted into the gate electrode of the MOS transistor M14, and the signal refdckn of a low level is inputted into the gate electrode of the MOS transistor M16.

The potential of the reference signal urefmosg_s at the time of the data 1 margin read is set up so that for example, the electric current of the sum of the electric current flowing through the memory cell 140 (here the memory cell 140*n*) storing the "H" side data and the electric current flowing through the MOS transistor M16 of the potential drawing-out unit 191 is greater than the electric current flowing through the memory cell 140 (here the memory cell 140*p*) storing the "L" side data of which the degradation of the data holding characteristics has advanced.

First, the explanation is made for the case where a pair of the memory cells 140 as the read target stores the data "1." In the positive memory 140*p*, the threshold voltage is low. Accordingly, an electric current flows through the memory cell 140 from the bit line 151*jp* (151*kp*) toward the source line 153 on the low voltage side. Then, the potential of the bit line 151*jp* (151*kp*) is drawn out and falls. On the other hand, in the negative memory 140*n*, an electric current flows from the bit line 151*jn* (151*kn*) toward the source line 153. However, the threshold voltage of the negative memory 140*n* is high. Accordingly, the electric current flowing from the bit line 151*jn* (151*kn*) toward the source line 153 is small as compared with the positive memory 140*p*. Then, an electric current flows from the bit line 151*jn* (151*kn*) toward the low-potential-side power source Vss via the MOS transistor M16. Accordingly, in the bit line 151*jn* (151*kn*), the potential is drawn out and falls.

When the degradation of the data holding characteristics of the positive memory 140*p* storing the "L" side data has advanced, the electric current flowing through the memory cell 140 from the bit line 151*jp* toward the source line 153 of the low voltage Vss decreases, as compared with the case where the degradation of the data holding characteristics has not advanced. Accordingly, the falling speed of the potential of the bit line 151*jp* (151*kp*) becomes slower than the falling speed of the potential of the bit line 151*jn* (151*kn*). Then, the potential of the bit line 151*jp* (151*kp*) becomes higher than the potential of the bit line 151*jn* (151*kn*), and the sense amplifier SA reads data "0" from a pair of the memory cells 140 storing data "1."

In this way, in the data 1 margin read, the sense amplifier SA reads wrong data "0" from a pair of the memory cells 140 storing data "1"; accordingly, a pair of the memory cells 140 of which the degradation of the data holding characteristics of data "1" has advanced is detected.

Then, when a pair of the memory cells 140 store data "0", for example, the potential of the bit line 151*jp* (151*kp*) does not become lower than the potential of the bit line 151*jn* (151*kn*) even when the data 1 margin read is performed; accordingly, the sense amplifier SA never reads out the wrong data.

<The Data 0 Margin Read>

In the data 0 margin read, to a pair of the memory cells 140 as the read target, the controller 120 performs the operation in which the memory cell (one of the memory cells) 140*p* and the bit line potential controller 190 are made to draw out the potential of the bit line (one of the bit lines) 151*jp* (151*kp*), the memory cell (the other of the memory cells) 140*n* is made to draw out the potential of the bit line (the other of the bit lines) 151*jn* (151*kn*), and concurrently, the sense amplifier SA is made to read the data. Therefore, in the potential drawing-out unit 191 at the time of the data 0 margin read, as illustrated in FIG. 19, the signal refdcjn of a low level is inputted into the gate electrode of the MOS transistor M14, and the signal refdckn of a high level is inputted into the gate electrode of the MOS transistor M16.

The potential of the reference signal urefmosg s at the time of the data 0 margin read is set up so that for example, the electric current of the sum of the electric current flowing through the memory cell 140 (here the memory cell 140p) which stores the "H" side data and of which the degradation of the data holding characteristics has advanced and the electric current flowing through the MOS transistor M14 of the potential drawing-out unit 191 is greater than the electric current flowing through the memory cell 140 (here the memory cell 140n) storing the "L" side data.

First, the explanation is made for the case where a pair of the memory cells 140 as the read target stores the data "0." In the positive memory 140p, the threshold voltage is high. Accordingly, an electric current flows through the memory cell 140 from the bit line 151jp (151kp) toward the source line 153 on the low voltage side. However, the threshold voltage of the positive memory 140p is high. Accordingly, the electric current flowing from the bit line 151jp (151kp) toward the source line 153 is small as compared with the negative memory 140n. Then, an electric current flows from the bit line 151jp (151kp) toward the low-potential-side power source Vss via the MOS transistor M14. Accordingly, in the bit line 151jp (151kp), the potential is drawn out and falls.

On the other hand, in the negative memory 140n, an electric current flows from the bit line 151jn (151kn) toward the source line 153. Then, the potential of the bit line 151jn (151kn) is drawn out and falls.

When the degradation of the data holding characteristics of the positive memory 140p storing the "H" side data has advanced, as compared with the case where the degradation of the data holding characteristics has not advanced, an electric current flowing through the memory cell 140 from the bit line 151jp toward the source line 153 of the low voltage Vss increases. Accordingly, the falling speed of the potential of the bit line 151jp (151kp) becomes faster than the falling speed of the potential of the bit line 151jn (151kn). Then, the potential of the bit line 151jp (151kp) becomes lower than the potential of the bit line 151jn (151kn), and the sense amplifier SA reads data "1" from a pair of the memory cells 140 storing data "0".

In this way, in the data 0 margin read, the sense amplifier SA reads wrong data "1" from a pair of the memory cells 140 storing data "0". Accordingly, a pair of the memory cells 140 of which the degradation of the data holding characteristics of data "0" has advanced is detected.

When a pair of the memory cells 140 store data "1", for example, the potential of the bit line 151jp (151kp) does not become higher than the potential of the bit line 151jn (151kn) even when the data 0 margin read is performed; accordingly, the sense amplifier SA never reads out the wrong data.

<A Refreshing Method of the Flash Memory>

Next, the refreshing method of the flash memory is explained. Also in the present embodiment, a series of processing related to the refresh operation is performed according to the flow chart illustrated in FIG. 14.

At first, at Step S1001, the leading address when performing the normal read and the data 1 margin read to be described later is set up. The leading address may be the leading address of the address space of the nonvolatile memory or may be the leading address of an erasing unit.

The word line 152 is selected based on the set leading address, and a pair of the memory cells 140 coupled to the word line 152 are selected as a pair of the memory cells 140 as the read target.

Step S1010 is a fourth read step at which the controller 120 performs the normal read. Specifically, the sense amplifier SA performs the normal read to a pair of the memory cells 140 as the read target selected at Step S1001.

Step S1020 is a fifth read step at which the controller 120 performs the data 1 margin read. Specifically, the sense amplifier SA performs the data 1 margin read to the memory cell 140 to which the normal read has been performed at the immediately preceding step S1010.

Step S1030 is a third data comparison step (the third data comparison operation) in which controller 120 compares the data read at the fourth read step S1010 and the data read at the fifth read step S1020. The controller 120 detects the memory cell 140 of which the degradation of the data holding characteristics of data "1" has advanced by comparing these pieces of data.

At Step S1030, when the controller 120 determines that the data read at the fourth read step S1010 and the data read at the fifth read step S1020 are different from each, other (No), Step S1040 is performed.

Step S1040 is a second refresh step (the second refresh operation) in which the controller 120 rewrites the data stored in a pair of the memory cells 140 as the read target into the pair of the memory cells 140 as the read target. For example, the controller 120 generates inverted data from the data read by the normal read to make a pair, and writes the pair of data into a pair of the memory cells 140 (140p, 140n) as the write data.

When the second refresh, operation is performed, the flow shifts to Step S1001, and the detection of the memory cell 140 of which the degradation of the data holding characteristics has advanced is performed again from the leading address. The leading address may be the leading address of the address space of the nonvolatile memory or may be the leading address of an erasing unit. That is, after performing the second, refresh operation, the controller 120 performs, to a pair of the memory cells 140 as the read target, the fourth read step S1010 (the fourth read operation), the fifth read step S1020 (the fifth read operation), and the third data comparison step S1030 (the third data comparison operation).

At Step S1030, when the controller 120 determines that the data read at the fourth read step S1010 and the data read at the fifth read step S1020 are the same (Yes), Step S1051 and Step S1052 are performed sequentially. Step S1051 and Step S1052 are already explained; accordingly, the detail explanation thereof is omitted here.

<The Effect by the Present Embodiment>

According to the present embodiment, in addition to the effect in the above-described embodiment, the following effects are obtained.

According to the present embodiment, to a pair of the memory cells 140p and 140n as the read target, the controller 120 performs the normal read (the fourth read operation, the fourth read step S1010) and the data 1 margin read (the fifth read operation, the fifth read step S1020). Then, the controller 120 performs the third data comparison operation (the third data comparison step S1030) to compare the data read by the normal read and the data read by the data 1 margin read. Then, at the third data comparison operation, when the controller 120 determines that the data read by the normal read and the data read by the data 1 margin read are different, the controller 120 performs the second refresh operation (the second refresh step S1040).

According to this configuration, also in the flash memory 100A of the complementary system, it is possible to detect a pair of the memory cells 140 of which the degradation of the data holding characteristics of data "1" has advanced, by performing the data 1 margin read with the read conditions of data "1" severer than the normal read. Accordingly, the refresh operation can be performed at the appropriate time before a read error occurs. In addition, according to the present configuration, the reliability of the flash memory 100A enhances and the reliability of the micro controller 300 that mounts the flash memory 100A enhances.

Furthermore, according to the present embodiment, after performing the second refresh operation at the second refresh step S1040, the controller 120 performs, to a pair of the memory cells 140p and 140n as the read target, the fourth read step S1010, the fifth read step S1020, and the third data comparison step S1030.

According to this configuration, it is reconfirmed whether the degradation of the data holding characteristics has advanced to a pair of the memory cells 140 to which the refresh operation, has been made. Accordingly, the reliability of the flash memory 100A is enhanced. Also according to the present configuration, the reliability of the micro controller 300 that mounts the flash memory 100A is enhanced.

Furthermore, according to the present embodiment, a pair of the memory cells 140p and 140n are coupled to the same word line 152.

According to this configuration, it is possible to perform the erase operation, the write operation, and the read operation without selecting plural word lines. Accordingly, the load related to these operations is reduced.

Embodiment 4

Next, Embodiment 4 of the present invention is explained. The present embodiment explains the case where the data 0 margin read is also performed in addition to the data 1 margin read, in the processing related to the refresh operation. Also in the present embodiment, a series of processing related to the refresh operation is performed according to the flow chart illustrated in FIG. 15. In the following, the explanation about the contents overlapping with the above-described embodiments is omitted in principle.

At Step S1030, when the controller 120 determines that the data read at the fourth read step S1010 and the data read at the fifth read step are the same (Yes), Step S2060 is performed.

Step S2060 is a sixth read step at which the controller 120 performs the data 0 margin read. Specifically, the sense amplifier SA performs the data 0 margin read to a pair of the memory cells 140 to which the read operation has been made at Step S1010 and Step S1020.

Step S2070 is a fourth data comparison step (the fourth data comparison operation) at which the controller 120 compares data read at the fourth read step S1010 with data read at the sixth read step S2060. The controller 120 detects a pair of the memory cells 140 of which the degradation of the data holding characteristics of data "0" has advanced by comparing these pieces of data.

At Step S2070, when the controller 120 determines that the data read at the fourth read step S1010 and the data read at the sixth read step S2060 are different from each, other (No), Step S2080 is performed. Step S2080 is a second refresh step. At Step S2080, the controller 120 performs the same processing as in the second refresh, step S1040 described above. Accordingly, the detailed explanation thereof is omitted here.

When the second refresh operation is performed, the flow shifts to Step S1001, and the detection, of a pair of the memory cells 140 of which, the degradation of the data holding characteristics has advanced is performed from the leading address. The leading address maybe the leading address of the address space of the nonvolatile memory or may be the leading address of an erasing unit. That is, after performing the refresh operation, the controller 120 performs, to a pair of the memory cells 140 as the read object, the fourth read step S1010 (the fourth read operation), the fifth read step S1020 (the fifth read operation), the third data comparison step S1030 (the third data comparison operation), the sixth read step S2060 (the sixth read operation), and the fourth data comparison step S2070 (the fourth data comparison operation).

At Step S2070, when the controller 120 determines that the data read at the fourth read step S1010 and the data read at the sixth read step S2060 are the same (Yes), Step S1051 and Step S1052 are performed sequentially. The processing at Step S1051 and Step S1052 is already explained; accordingly, the detailed explanation thereof is omitted.

<The Effect by the Present Embodiment>

According to the present embodiment, in addition to the effect in the above-described embodiments, the following effects are obtained.

According to the present embodiment, when, in the third data comparison operation (the third data comparison step S1030), the controller 120 determines that the data read by the normal read (the fourth read operation, the fourth read step S1010) and the data read by the data 1 margin read (the fifth read operation, the fifth read step S1020) are the same, the controller 120 performs the data 0 margin read (the sixth read operation, the sixth read step S2060). Then, the controller 120 performs the fourth data comparison operation (the fourth data comparison step S2070) to compare the data read by the normal read with the data read by the data 0 margin read. In the fourth data comparison operation, when the controller 120 determines that the data read by the normal read and the data read by the data 0 margin read are different from each other, the controller 120 performs the second refresh operation (the second refresh step S2080).

According to this configuration, also in the flash memory 100A of the complementary system, the controller 120 also performs the data 0 margin read, after performing the data 1margin read. Accordingly, it is possible to improve the accuracy to detect, a pair of the memory cells 140 of which the degradation of the data holding characteristics has advanced. Accordingly, the reliability of the flash memory 100A improves more, and the reliability of the micro controller 300 that mounts the flash memory 100A improves.

Furthermore, according to the present embodiment, after performing the second refresh operation (the second refresh step S2080), the controller 120 performs, to a pair of the memory cells 140 as the read object to which the second refresh operation has been performed, the normal read (the fourth read operation, the fourth read step S1010), the data 1 margin, read (the fifth read operation, the fifth read step S1020), the third data comparison operation (the third data comparison step S1030), the data 0 margin read (the sixth read operation, the sixth read step S2060), and the fourth data comparison operation (the fourth data comparison step S2070).

According to this configuration, also when, the data 0margin read is performed, it is reconfirmed whether the degradation of the data holding characteristics has advanced, to the memory cell 140 to which the second refresh, operation has been performed. Accordingly, the reliability of the flash memory 100A improves more, and the reliability of the micro controller 300 that mounts the flash memory 100 improves more.

Embodiment 5

Next, Embodiment 5 of the invention is explained. The present embodiment describes the case where, in the refresh operation in the flash memory of the complementary system, the margin read is performed to the memory cell 140 storing the "L" side data. In the following, the explanation about the contents overlapping with the above-described embodiments is omitted in principle.

<The Configuration of the Flash Memory>

Figure 20:
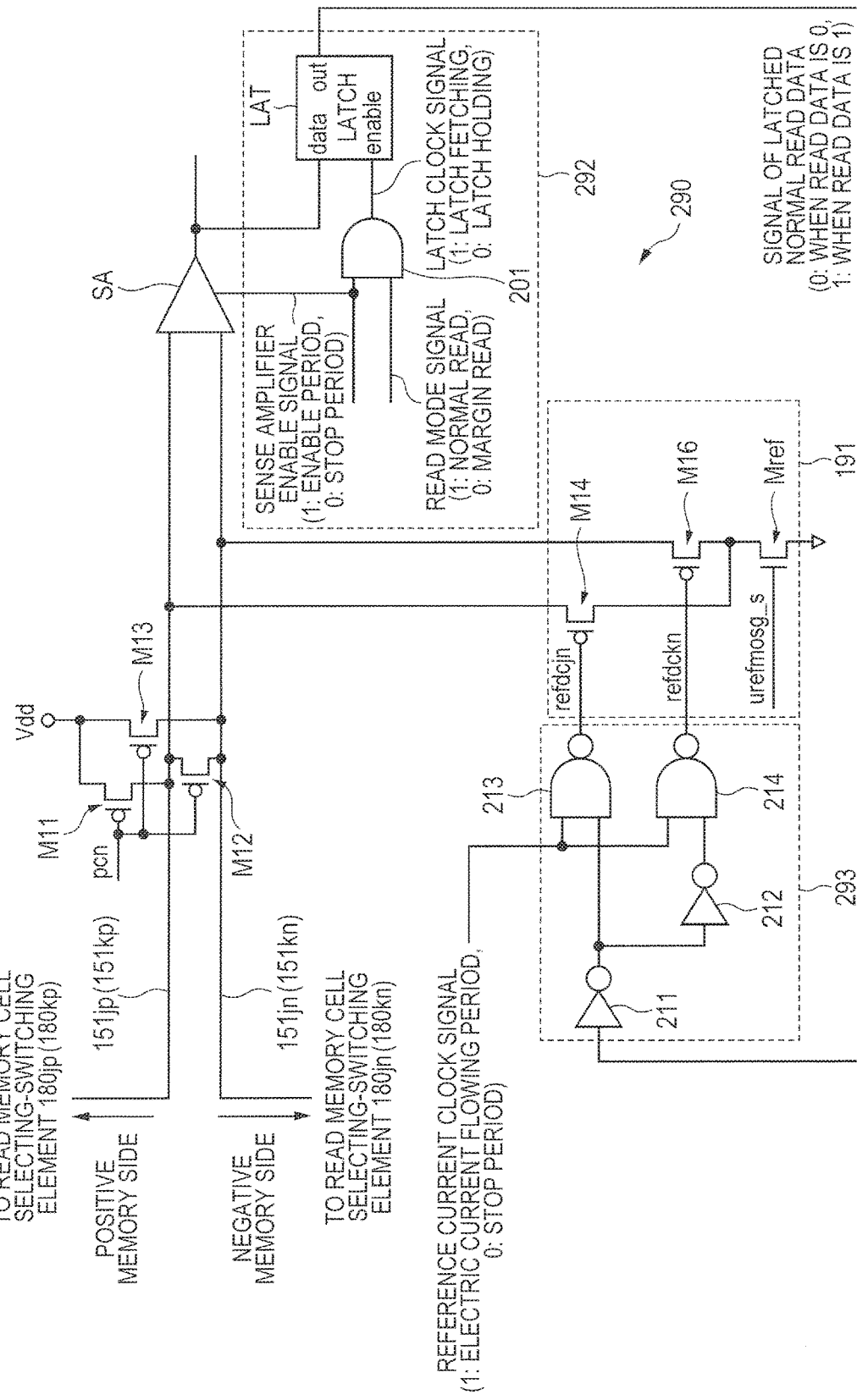
FIG. 20 is a drawing illustrating an example of the circuit configuration of a sense amplifier and the periphery thereof according to Embodiment 5 of the present invention.

FIG. 20 illustrates an example of the circuit configuration of the sense amplifier and the periphery thereof according to Embodiment 5 of the present invention. The bit line potential controller 290 includes a potential drawing-out unit 191, a read-out data holding unit 292, and a potential drawing-out bit-line selector 293, as illustrated in FIG. 20.

The read-out data holding unit 292 includes a gate circuit 201 and a latch circuit LAT. One input terminal of the gate circuit 201 is coupled to the input terminal of the enable signal that switches ON/OFF of the sense amplifier SA.

The sense amplifier SA is turned on when the enable signal of a high level is inputted, and is turned off when the enable signal of a low level is inputted. Therefore, when the sense amplifier SA is turned on, the enable signal of a high level is inputted into the one input terminal of the gate circuit 201. On the other hand, when the sense amplifier SA is turned off, the enable signal of a low level is inputted into the one input terminal of the gate circuit 201.

The read mode signal according to the read mode (the normal read and the margin read) is inputted into the other input terminal of the gate circuit 201. At the time of the normal read, the read mode signal of a high level is inputted into the other input terminal of the gate circuit 201, for example. On the other hand, at the time of the L-side data margin read to be described later, the read mode signal of a low level is inputted into the other input terminal of the gate circuit 201, for example.

The output terminal of the gate circuit 201 is coupled to the latch clock signal input terminal (enable) that switches ON/OFF of the latch circuit LAT.

The gate circuit 201 outputs the latch clock signal of a high level when the enable signal of a high level is inputted into the one input terminal and the read mode signal of a high level is inputted into the other input terminal. On the other hand, the gate circuit 201 outputs the latch clock signal of a low level when a signal of a low level is inputted into any one of the input terminals.

The data input terminal (data) of the latch circuit LAT is coupled to the output terminal of the sense amplifier SA. The data output terminal (out) of the latch circuit LAT is coupled to an input terminal of the gate circuit 211 of the potential drawing-out bit-line selector 293 to be described later.

The latch circuit LAT fetches and stores the data outputted from the sense amplifier SA. Specifically, when the latch clock signal of a high level is inputted into the latch clock signal input terminal of the latch circuit LAT, the latch circuit LAT is turned on, and the latch circuit LAT fetches and stores the data that the sense amplifier SA has read from a pair of the memory cells 140 (140p, 140n). The sense amplifier SA outputs a signal of a high level as the read data for example when data "1" is read from a pair of the memory cells 140 (140p, 140n), and outputs a signal of a low level as the read data for example when data "0" is read. The latch circuit. LAT outputs the fetched data to the potential drawing-out bit-line selector 293.

The potential drawing-out bit-line selector 293 includes gate circuits 211 to 214. The input terminal of the gate circuit 211 is coupled, to the data output terminal (out) of the latch circuit LAT. An output terminal of the gate circuit 211 is coupled to an input terminal of the gate circuit 212 and one input terminal of the gate circuit 213. An output terminal of the gate circuit 212 is coupled to one input terminal of the gate circuit 214. A reference current clock signal is inputted into the other input terminal of the gate circuit 213 and the other input terminal of the gate circuit 214.

The reference current clock signal is a signal that becomes active at the time of performing the L-side data margin read to be described later. That is, at the time of performing the L-side data margin read, the reference current clock signal of a high level is inputted into each of the other input terminals of the gate circuits 213 and 214. On the other hand, when not performing the L-side data margin read, the reference current clock signal of a low level is inputted into each of the other input terminals of the gate circuits 213 and 214.

Next, the read operation in the present embodiment is explained. FIG. 21A and FIG. 21B illustrate the list of the potential applied to the potential drawing-out unit at the time of each read operation according to Embodiment 5 of the present invention. FIG. 21A illustrates the normal read, and FIG. 21B illustrates the L-side data margin read.

In the present embodiment, in order to determine whether the refresh operation to be described later is performed, the normal read (the fourth read operation) and the L-side data margin read (the fifth read operation) are performed.

<The Normal Read>

As is the case with Embodiments 3 and 4 described above, in the normal read, the controller 120 performs the operation in which, to a pair of the memory cells 140 as the read object, the memory cell (one memory cell) 140p is made to draw out the potential of the bit line (one of the bit lines) 151jp (151kp), the memory cell (the other of the memory cells) 140n is made to draw out the potential of the bit line (the other of the bit lines) 151jn (151kn), and concurrently, the sense amplifier SA is made to read the data.

The operation of the bit line potential controller 290 in this case is explained in detail in the following. The enable signal of a high level is inputted into the one input terminal of the gate circuit 201. The read mode signal of a high level is inputted into the other input terminal of the gate circuit 201. Accordingly, the gate circuit 201 outputs the latch clock signal of a high level. Accordingly, the latch circuit LAT is turned on, and the latch circuit LAT fetches and stores the signal outputted from the sense amplifier SA. At this time, when the data read from a pair of the memory cells 140 (140p, 140n) is "1", the latch circuit LAT stores the signal of a high level, for example. When the data read from a pair of the memory cells 140 (140p, 140n) is "0", the latch circuit LAT stores the signal of a low level, for example. The latch circuit LAT outputs the stored data to the potential drawing-out bit-line selector 293.

The signal outputted from the latch circuit LAT is inputted into the input terminal of the gate circuit 211 of the potential drawing-out bit-line selector 293. Accordingly, the inverted signal of the signal inputted into the input terminal of the gate circuit 211 is inputted into the one input terminal of the gate circuit 213. The signal further inverted in the gate circuit 212, that is, the same signal as the signal inputted into the input terminal of the gate circuit 211, is inputted into the one input terminal of the gate circuit 214.

Specifically, when data "1" is read by the sense amplifier SA, a signal of a high level is inputted into the input terminal of the gate circuit 211. Accordingly, the signal of a low level is inputted into the one input terminal of the gate circuit 213, and the signal of a high level is inputted into the one input terminal of the gate circuit 214. On the other hand, when data "0" is read by the sense amplifier SA, a signal of a low level is inputted into the input terminal of the gate circuit 211. Accordingly, the signal of a high level is inputted into the one input terminal of the gate circuit 213, and the signal of a low level is inputted into the one input terminal of the gate circuit 214.

In the normal read, the reference current clock signal of a low level is inputted into the other input terminals of the gate circuits 213 and 214, respectively. Therefore, the gate circuits 213 and 214 output the potential drawing-out switching signals refdcjn and refdckn of a high level, respectively, as illustrated in FIG. 21A. Therefore, the MOS transistors M14 and M16 are turned off, and the potential drawing out of the bit lines 151*jp* (151*kp*) and 151*jn* (151*kn*) via the potential drawing-out unit 191 is not performed.

<The L-Side Data Margin Read>

In the L-side data margin read, based on the data read by the normal read, the controller 120 performs the operation in which the memory cell 140 with a low threshold voltage of the pair of the memory cells 140 (140*p*, 140*n*) is made to draw out the potential of the bit line 151 coupled to the memory cell 140 with the low threshold voltage, the memory cell 140 with a high threshold voltage of the pair of the memory cells 140 (140*p*, 140*n*) and the bit line potential controller 290 are made to draw out the potential of the bit line 151 coupled to the memory cell 140 with a high threshold voltage, and concurrently, the sense amplifier SA is made to read data.

Therefore, at the time of the L-side data margin read, in the potential drawing-out unit 191, as illustrated in FIG. 21B, the potential drawing-out switching signals refdcjn and refdckn to be inputted into the respective gate electrodes of the MOS transistors M14 and M16 are switched, according to the data read from the pair of the memory cells 140 (140*p*, 140*n*).

In the L-side data margin read, the reference current clock signal of a high level is inputted into the other input terminal of the gate circuits 213 and 214, respectively. When data "1" is read by the sense amplifier SA, the signal of a low level is inputted into the one input terminal of the gate circuit 213, and the signal of a high level is inputted into the one input terminal of the gate circuit 214. Therefore, as illustrated in FIG. 21B, the gate circuit 213 outputs the potential drawing-out switching signal refdcjn of a high level, and the gate circuit 214 outputs the potential drawing-out switching signal refdckn of a low level. Accordingly, the MOS transistor M14 is turned off and the MOS transistor M16 is turned on. Therefore, the potential drawing out of the bit line 151*jp* (151*kp*) is not performed from the MOS transistor M14, however, the potential drawing out of the bit line 151*jn* (151*kn*) is performed from the MOS transistor M16. That is, the bit line 151*jn* (151*kn*) is coupled to the negative memory (the memory cell 140*n*) storing the "H" side data, and the potential of the bit line 151*jn* (151*kn*) coupled to the memory cell 140*n* is drawn out from the MOS transistor M16.

On the other hand, when data "0" is read by the sense amplifier SA, the signal of a high level is inputted into the one input terminal of the gate circuit 213, and the signal of a low level is inputted into the one input terminal of the gate circuit 214. Therefore, as illustrated in FIG. 21B, the gate circuit 213 outputs the potential drawing-out switching signal refdcjn of a low level, and the gate circuit 214 outputs the potential drawing-out switching signal refdckn of a high level. Accordingly, the MOS transistor M14 is turned on and the MOS transistor M16 is turned off. Therefore, the potential drawing out of the bit line 151*jn* (151*kn*) is not performed from the MOS transistor M16, however, the potential drawing out of the bit line 151*jp* (151*kp*) is performed from the MOS transistor M14. That is, the bit line 151*jp* (151*kp*) is coupled to the positive memory (the memory cell 140*p*) storing the "H" side data, and the potential of the bit line 151*jp* (151*kp*) couple to the memory cell 140*p* is drawn out from the MOS transistor M14, In this way, in the L-side data margin read, the potential of the bit line 151 coupled to the memory cell 140 storing the "H" side data is drawn out from the potential drawing-out unit 191, irrespective of the data that the pair of the memory cells 140 store.

<A Refreshing Method of the Flash Memory>

Figure 22:
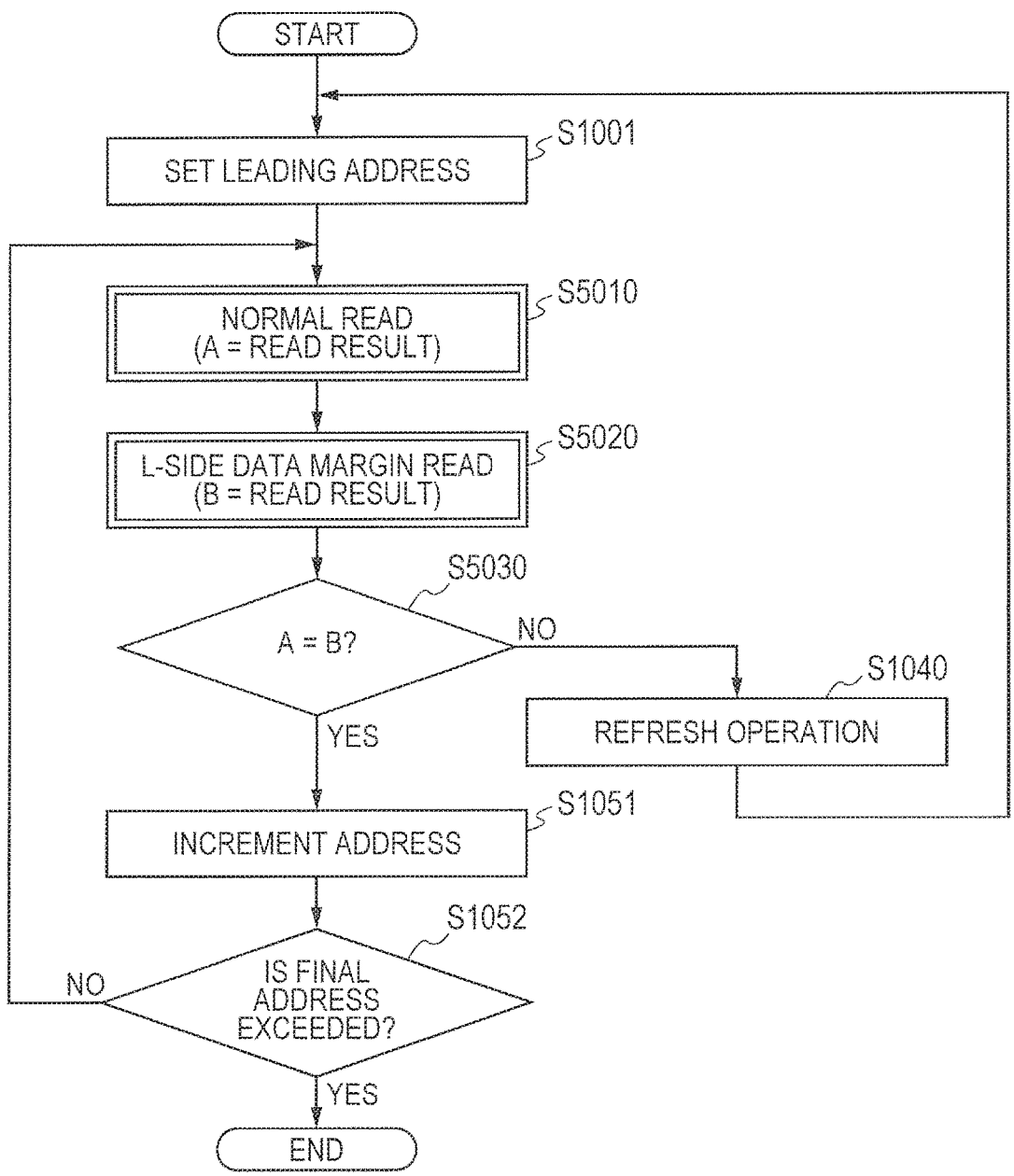
FIG. 22 is a flow chart illustrating the refreshing method of a flash memory according to Embodiment 5 of the present invention.

Next, the refreshing method of the flash memory is explained. FIG. 22 is a flow chart illustrating the refreshing method of the flash memory according to Embodiment 5 of the present invention. In the present embodiment, as illustrated in FIG. 22, after performing the normal read, the L-side data margin read is performed.

At first, at Step S1001, the leading address when performing the normal read and the L-side data margin read is set up. The leading address may be the leading address of the address space of the nonvolatile memory or may be the leading address of an erasing unit. The word line 152 is selected based on the set-up leading address, and a pair of the memory cells 140 coupled to the word line 152 are selected as the pair of the memory cells 140 as the read target.

Step S5010 is the fourth read step at which the controller 120 performs the normal read. Specifically, the sense amplifier SA performs the normal read to the pair of the memory cells 140 as the read target selected at Step S1001.

The latch circuit LAT fetches and stores the data that the sense amplifier SA has read. The latch circuit LAT outputs the signal based on the stored data to the potential drawing-out bit-line selector 293. In the potential drawing-out bit-line selector 293, a signal based on the signal outputted from the latch circuit LAT is inputted into each of the one input terminals of the gate circuits 213 and 214. That is, a signal of a low level is inputted into the one input terminal of the gate circuit coupled to the gate terminal of the MOS transistor on the side of the memory cell 140 storing the "L" side data. On the other hand, a signal of a high level is inputted into the one input terminal of the gate circuit coupled to the gate terminal of the MOS transistor on the side of the memory cell 140 storing the "H" side data.

Step S5020 is a seventh read step at which the controller 120 performs the "L" side margin read. Specifically, the sense amplifier SA always performs the L-side data margin read to the memory cell 140 to which the normal read has been performed at the immediately preceding step S5010.

Step S5030 is a fifth data comparison step (the fifth data comparison operation) at which the controller 120 compares the data read at the fourth read step S5010 with the data read at the seventh read step S5020. The controller 120 detects the memory cell 140 of which the degradation of the data holding characteristics of the "L" side data has advanced, by comparing these pieces of data.

At Step S5030, when the controller 120 determines that the data read at the fourth read step S5010 and the data read at the seventh read step S5020 are different from each other (No), Step S1040 is performed. The processing at Step S1040 is already explained in Embodiment 3. Accordingly, the detailed explanation thereof is omitted here.

At Step S5030, when the controller 120 determines that the data read at the fourth read step S5010 and the data read at the seventh read step S5020 are the same (Yes), Step S1051 and Step S1052 are performed sequentially. The processing at Step S1051 and Step S1052 is already explained; accordingly, the detailed explanation thereof is omitted.

<The Effect by the Present Embodiment>

According to the present embodiment, in addition to the effect in the above-described embodiments, the following effects are obtained. According to the present embodiment, the controller 120 performs the L-side data margin read after performing the normal read.

According to this configuration, also in the flash memory of the complementary system, the margin read is performed only to the memory cell 140 which stores the "L" side data and of which the degradation of the data holding characteristics is significant. Accordingly, the memory cell 140 of which the degradation of the data holding characteristics has advanced is detected efficiently. No margin read is performed to the memory cell 140 storing the "H" side data. Accordingly, it is possible to shorten the time required for detecting the memory cell 140 of which the degradation of the data holding characteristics has advanced.

Embodiment 6

Next, Embodiment 6 of the invention is explained. The present embodiment explains a flash memory provided with an error corrector to be described later. In the following, the explanation about the contents overlapping with the above-described embodiments is omitted in principle. In the following explanation, the contents regarding the flash memory 100 and the contents regarding the flash memory 100A are explained collectively, and are explained individually depending on the case.

<The Configuration of the Flash Memory>

Figure 23:
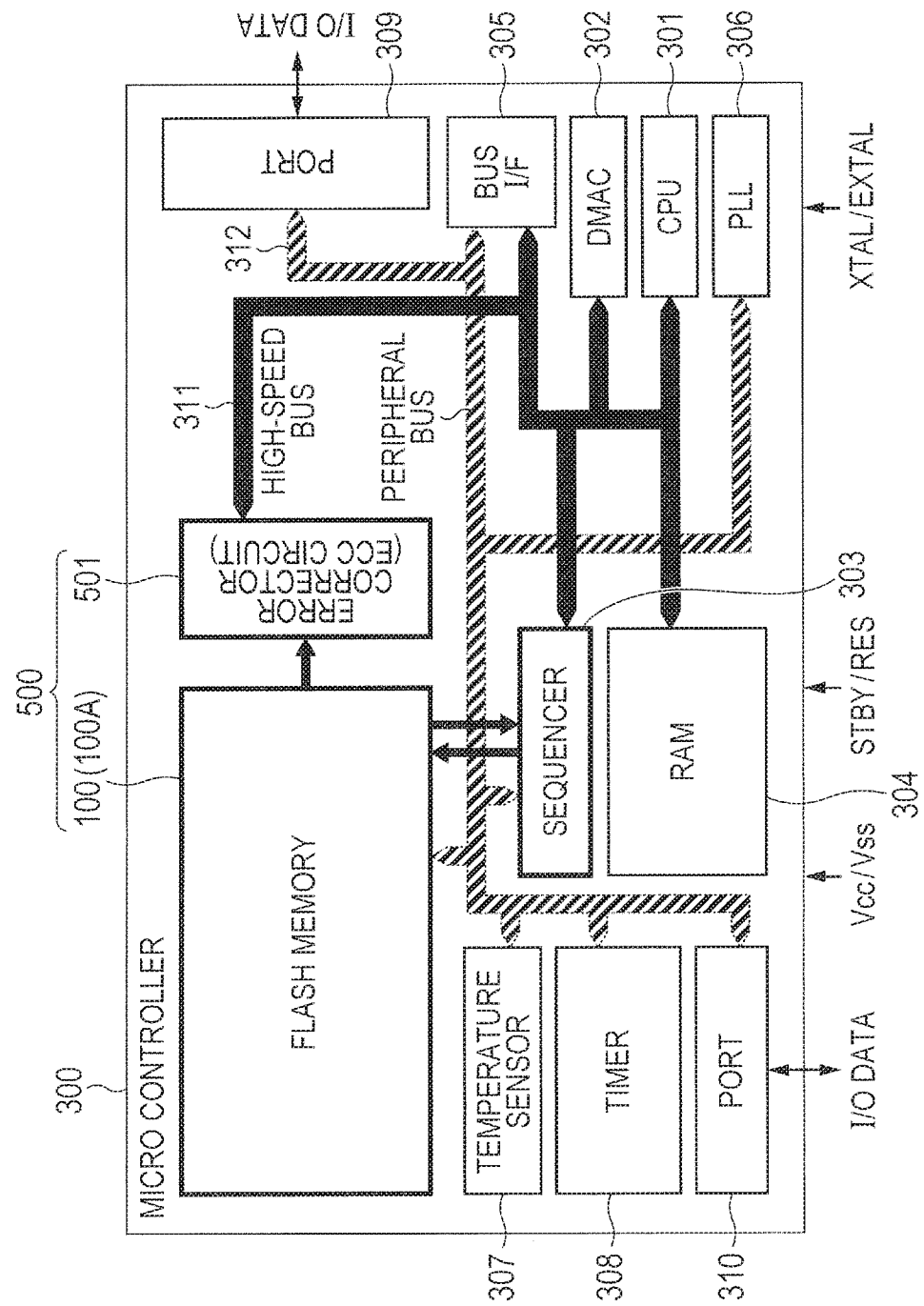
FIG. 23 is a block diagram illustrating an example of the configuration of a micro controller that mounts a flash memory according to Embodiment 6 of the present invention.

FIG. 23 is a block diagram illustrating an example of the configuration of the micro controller that mounts the flash memory according to Embodiment 6 of the present invention. The flash memory 500 according to the present embodiment is comprised of the flash memory 100 (100A) and an error corrector 501 that is coupled to the flash memory 100 (100A). The error corrector 501 is comprised of an ECC (Error Checking and Correcting) circuit, for example.

As illustrated in FIG. 23, the error corrector 501 is coupled to the high-speed bus 311, and performs data input/output via the high-speed bus 311. The error corrector 501 generates error correcting data based on the data, and generates error corrected data in which error of the data read by the sense amplifier has been corrected. The error in the present embodiment means that the data written in the memory cell is different from the data read from the sense amplifier SA.

The error corrector 501 generates error correcting data from the write data inputted via the high-speed bus 311, or from the data written in the memory cell 140, for example. The generated error correcting data may be stored in the memory array 108 (108A) with the original data, or may be stored in a memory device (not shown) separately from the original data. When an error is detected, the error corrector 501 generates the error corrected data based on the data read from the sense amplifier SA and the error correcting data.

Based on instructions of the controller 120, the error corrector 501 may generate an error correcting data or may switch ON/OFF of the error correction function to generate the error corrected data. For example, when the error correction function is turned off, the error corrector 501 outputs the data inputted from the high-speed bus 311 to the flash memories 100 and 100A as it is, and does not perform the error detection to the data read from the sense amplifier SA. That is, in such a case, the flash memory 500 according to the present embodiment has function equivalent to the flash memories 100 and 100A explained in the embodiments described above.

<A Refreshing Method of the Flash Memory>

Figure 24:
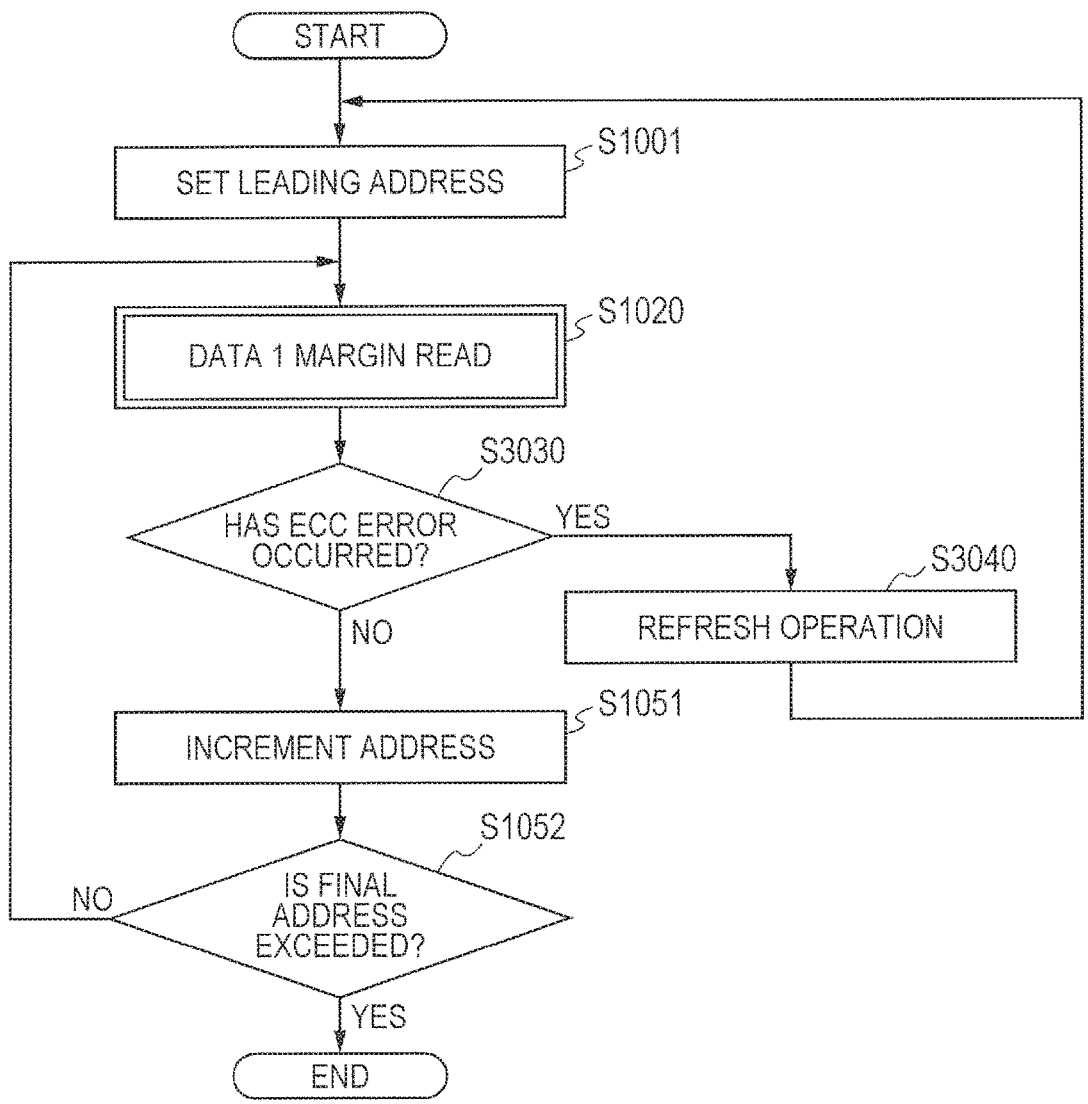
FIG. 24 is a flow chart illustrating the refreshing method of a flash memory according to Embodiment 6 of the present invention.

Next, the refreshing method of the flash memory is explained. FIG. 24 is a flow chart illustrating the refreshing method of the flash memory according to Embodiment 6 of the present invention.

Step S1001 is already explained; accordingly, the detailed explanation thereof is omitted.

At Step S1020, the controller 120 performs the data 1margin read. In the flash memory 100, the controller 120 performs the data 1 margin read by the second read operation. In the flash memory 100A, the controller 120 performs the data 1 margin read by the fifth read operation.

Next, Step S3030 is explained. In the flash memory 100, the controller 120 performs the first error detection operation in which the error corrector 501 is made to detect the error of data, based on the data read by the data 1 margin read (the second read operation) and the error correcting data. That is, Step S3030 in the flash memory 100 is the first error detection step.

On the other hand, in the flash memory 100A, the controller 120 performs the third error detection operation in which the error corrector 501 is made to detect the error of data based on the data read by the data 1 margin read (the fifth read operation) and the error correcting data. That is, Step S3030 in the flash memory 100A is the third error detection step.

For example, the controller 120 outputs the data read by the data 1 margin read (the second and the fifth read operation) to the error corrector 501. The error corrector 501 detects the error of the data read by the data 1 margin read, based on the data outputted from, the controller 120 and the error correcting data read from the memory array 108 (108A) or the memory device (not shown).

At Step S3030 (the first and the third error detection step), when the error corrector 501 detects the error of the data read by the data 1 margin read (the second and the fifth read operation) (Yes), Step S3040 is performed.

Next, Step S3040 is explained. In the flash memory 100, the controller 120 performs the third refresh operation in which the error corrector 501 is made to generate the error corrected data of which the error is corrected based on the data read by the data 1 margin read (the second read operation) and the error correcting data, and the error corrected data is rewritten in the memory cell 140 as the read target. That is, Step S3040 in the flash memory 100 is the third refresh step.

On the other hand, in the flash memory 100A, the controller 120 performs the fifth refresh operation in which the error corrector 501 is made to generate the error corrected data of which the error is corrected based on the data read by the data 1 margin read (the fifth read operation) and the error correcting data, and the error corrected data is rewritten in the pair of the memory cells 140p and 140n as the read target. That is, Step S3040 in the flash memory 100A is the fifth refresh step.

The error corrected data generated at Step S3040 is the same as the write data when the initial data has been stored in the memory cell 140 and the pair of the memory cells 140p and 140n.

When the third refresh operation and the fifth refresh operation are performed, the flow shifts to Step S1001, and the detection of the memory cell 140 and a pair of the memory cells 140p and 140n of which the degradation of the data holding characteristics has advanced is performed again from the leading address. The leading address may be the leading address of the address space of the nonvolatile memory or may be the leading address of an erasing unit. That is, after performing the third refresh operation and the fifth refresh operation, the controller 120 performs, Step S1020 (the second and the fifth read step) and Step S3030 (the first and the third error detection step), to the memory cell 140 and the pair of the memory cells 140p and 140n as the read target.

At Step S3030, when the error corrector 501 does not detect the error of the data read at Step S1020 (the second and the fifth read step) (No), Step S1051 and Step S1052 are performed sequentially. Step S1051 and Step S1052 are already explained; accordingly, the detailed explanation thereof is omitted.

<The Effect by the Present Embodiment>

According to the present embodiment, in addition to the effect in the above-described embodiments, the following effects are obtained. According to the present embodiment, the error corrector 501 is included, and the controller 120 performs the data 1 margin read (the second and the fifth read operation, the second and the fifth read step S1020), and the first and the third error detection operation (the first and the third error detection step S3030), in which the error corrector 501 is made to detect, the error of data, based, on the data read by the data 1 margin read and the error correcting data. Then, when the error corrector 501 detects the error of the data read by the data 1 margin, read in the first and the third error detection operation, the controller 120 performs the third and the fifth refresh operation (the third and the fifth refresh step S3040), in which the error corrector 501 is made to generate the error corrected data of which the error correction has been performed based on the data read by the data 1 margin read and the error correcting data, and the error corrected data is rewritten to the memory cell 140 and the pair of the memory cells 140p and 140n, as the read target.

According to this configuration, it is not necessary to perform the normal read. Accordingly, the time required for the error detection of the data read by the sense amplifier SA is shortened, and the time related to the refresh operation is shortened. Accordingly, the power consumption related to the refresh operation is reduced.

Furthermore, according to the present embodiment, after performing the third and the fifth refresh operation (the third and the fifth refresh step S3040), the controller 120 performs, to the memory cell 140 and the pair of the memory cells 140p and 140n as the read target, the data 1 margin read (the second and the fifth read operation, the second and the fifth read step S1020), and the first and the third error detection operation (the first and the third error detection step S3030), According to this configuration, it is reconfirmed whether the degradation of the data holding characteristics has advanced, to the memory cell 140 and the pair of the memory cells 140p and 140n to which the refresh operation has been performed. Accordingly, it is possible to enhance the reliability of the flash memories 100 and 100A, and the reliability of the flash memory 500 in the end. Accordingly, it is possible to enhance the reliability of the micro controller 300 that mounts the flash memory 500.

Embodiment 7

Figure 25:
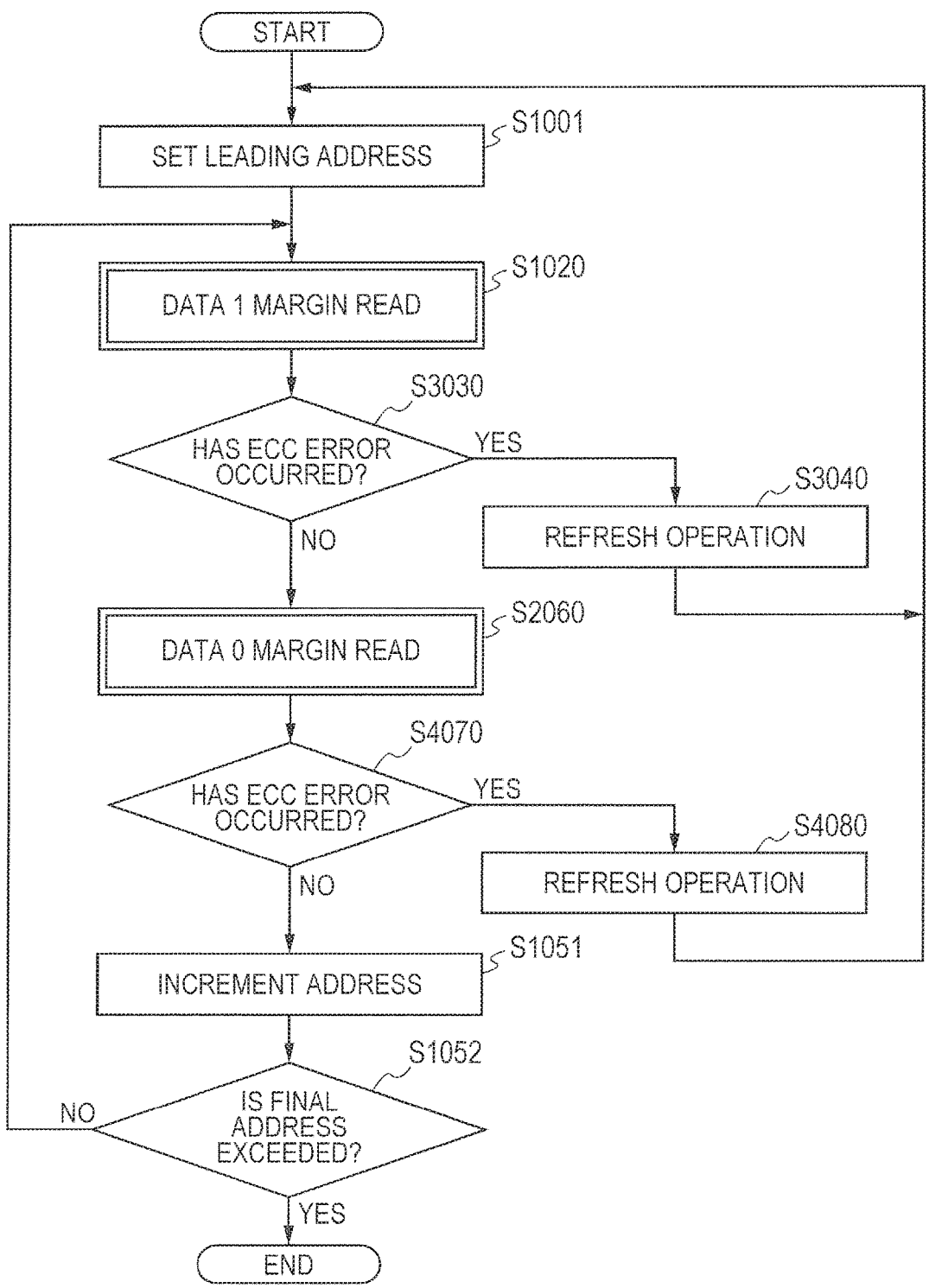
FIG. 25 is a flow chart illustrating the refreshing method of a flash memory according to Embodiment 7 of the present invention.

Next, Embodiment 7 of the invention is explained. The present embodiment explains the case where, in the refresh operation of the flash memory 500 (100, 100A) provided with the error corrector 501, the data 0 margin read is also performed in addition to the data 1 margin read. FIG. 25 is a flow chart illustrating the refreshing method of the flash memory according to Embodiment 7 of the present invention. In the following, the explanation about the contents overlapping with the above-described embodiments is omitted in principle.

At Step S3030, when the error corrector 501 does not detect the error of the data read at Step S1020 (the second and the fifth read step) (No), Step S2060 is performed.

At Step S2060, the controller 120 performs the data 0margin read. In the flash memory 100, the controller 120 performs the data 0 margin read by the third read operation. In the flash memory 100A, the controller 120 performs the data 0 margin read by the sixth read operation.

Next, Step S4070 is explained. In the flash memory 100, the controller 120 performs the second error detection operation in which the error corrector 501 is made to detect the error of the data based on the data read by the data 0 margin read (the third read operation) and the error correcting data. That is, Step S4070 in the flash memory 100 is the second error detection step.

On the other hand, in the flash memory 100A, the controller 120 performs the fourth error detection operation in which the error corrector 501 is made to detect the error of the data based on the data read by the data 0 margin read (the sixth read operation) and the error correcting data. That is, Step S4070 in the flash memory 100A is the fourth error detection step.

For example, the controller 120 outputs the data read by the data 0 margin read (the third and the sixth read operation) to the error corrector 501. The error corrector 501 detects the error of the data read by the data 0 margin read from the data outputted from the controller 120 and the error correcting data read from the memory array 108 (108A) or a memory device (not shown).

At Step S4070 (the second and the fourth error detection step), when the error corrector 501 detects the error of the data read by the data 0 margin read (the third and the sixth read operation) (Yes), Step S4080 is performed.

Next, Step S4080 is explained. In the flash memory 100, the controller 120 performs the fourth refresh operation in which the error corrector 501 is made to generate the error corrected data to which the error correction has been performed based on the data read by the data 0 margin read (the third read operation) and the error correcting data, and the error corrected data is rewritten in the memory cell 140 as the read target. That is, Step S4080 in the flash memory 100 is the fourth refresh step.

On the other hand, in the flash memory 100A, the controller 120 performs the sixth refresh operation in which the error corrector 501 is made to generate the error corrected data to which the error correction has been performed based on the data read by the data 0 margin read (the fifth read operation) and the error correcting data, and the error corrected data is rewritten in the pair of the memory cells 140*p* and 140*n* as the read target. That is, Step S4080 in the flash memory 100A is the sixth refresh step.

The error corrected data generated at Step S4080 is the same as the write data when the initial data has been stored in the memory cell 140 and the pair of the memory cells 140*p* and 140*n*.

When the fourth and the sixth refresh operation are performed, the flow shifts to Step S1001, and the detection of the memory cell 140 and a pair of the memory cells 140*p* and 140*n* of which the degradation of the data holding characteristics has advanced is performed again from the leading address. The leading address may be the leading address of the address space of the nonvolatile memory or may be the leading address of an erasing unit. That is, after performing the fourth and the sixth refresh operation, the controller 120 performs, to the memory cell 140 and the pair of the memory cells 140*p* and 140*n* as the read target, Step S1020 (the second and the fifth read step), Step S3030 (the first and the third error detection step), Step S2060 (the third and the sixth read step), and Step S4070 (the second and the fourth error detection step).

At Step S4070, when the error corrector 501 does not detect the error of the data read at Step S2060 (the third and the sixth read step) (No), Step S1051 and Step S1052 are performed sequentially. Step S1051 and Step S1052 are already explained; accordingly, the detailed explanation thereof is omitted.

<The Effect by the Present Embodiment>

According to the present embodiment, in addition to the effect in the above-described embodiments, the following effects are obtained. According to the present embodiment, at Step S3030, when the error corrector 501 does not detect the error of the data read by the data 1 margin read (the second and the fifth read operation, the second and the fifth read step S1020), the controller 120 performs the data 0 margin read (the third and the sixth read operation, the third and the sixth read step S2060), and the second and the fourth error detection operation (the second and the fourth error detection step S4070) in which the error corrector 501 is made to detect the error of the data based on the data read by the data 0 margin read and the error correcting data.

When the error corrector 501 detects the error of the data read by the data 0 margin read in the second and the fourth error detection operation, the controller 120 performs the fourth and the sixth refresh operation (the fourth and the sixth refresh step S4080), in which the error corrector 501 is made to generate the error corrected data of which the error correction has been performed based on the data read by the data 0 margin read and the error correcting data, and the error corrected data is rewritten to the memory cell 140 and the pair of the memory cells 140*p* and 140*n*, as the read target.

According to this configuration, the controller 120 also performs the data 0 margin read, after performing the data 1margin read. Accordingly, it is possible to improve the accuracy to detect the memory cell 140 and the pair of the memory cells 140*p* and 140*n* of which the degradation of the data holding characteristics has advanced. Accordingly, it is possible to enhance more the reliability of the flash memories 100 and 100A and it is possible to enhance the reliability of the flash memories 100 and 100A, and the reliability of the flash memory 500 in the end. Accordingly, it is possible to enhance the reliability of the micro controller 300 that mounts the flash memory 500.

Furthermore, according to the present embodiment, after performing the fourth and the sixth refresh operation (the fourth and the sixth refresh step S4080), the controller 120 performs, to the memory cell 140 and the pair of the memory cells 140*p* and 140*n* as the read target, the data 1 margin read (the second and the fifth read operation, the second and the fifth read step S1020), the first and the third error detection operation (the first and the third error detection step S3030), the data 0 margin read (the third and the sixth read operation, the third and the sixth read step S2060), and the second and the fourth error detection operation (the second and the fourth error detection step S4070).

According to this configuration, it is reconfirmed whether the degradation of the data holding characteristics has advanced, to the memory cell 140 and the pair of the memory cells 140*p* and 140*n* to which the refresh operation has been performed. Accordingly, it is possible to enhance more the reliability of the flash memories 100 and 100A, and the reliability of the flash memory 500 in the end. Accordingly, it is possible to enhance more the reliability of the micro controller 300 that mounts the flash memory 500.

Embodiment 8

Next, Embodiment 8 of the invention is explained. The present embodiment explains the case where the normal read and the L-side data margin read are performed, in the refresh operation of the flash memory 500 (100A) of the complementary system which is provided with the error corrector 501. In the following, the explanation about the contents overlapping with the above-described embodiments is omitted in principle.

The flash memory 500 according to the present embodiment includes the bit line potential controller 290 illustrate in FIG. 20. The bit line potential controller 290 is already explained in Embodiment 5; accordingly, the detailed explanation thereof is omitted here. The normal read and the L-side data margin read in the present embodiment are also already explained in Embodiment 5; accordingly, the detailed explanation thereof is omitted here.

<A Refreshing Method of the Flash Memory>

Figure 26:
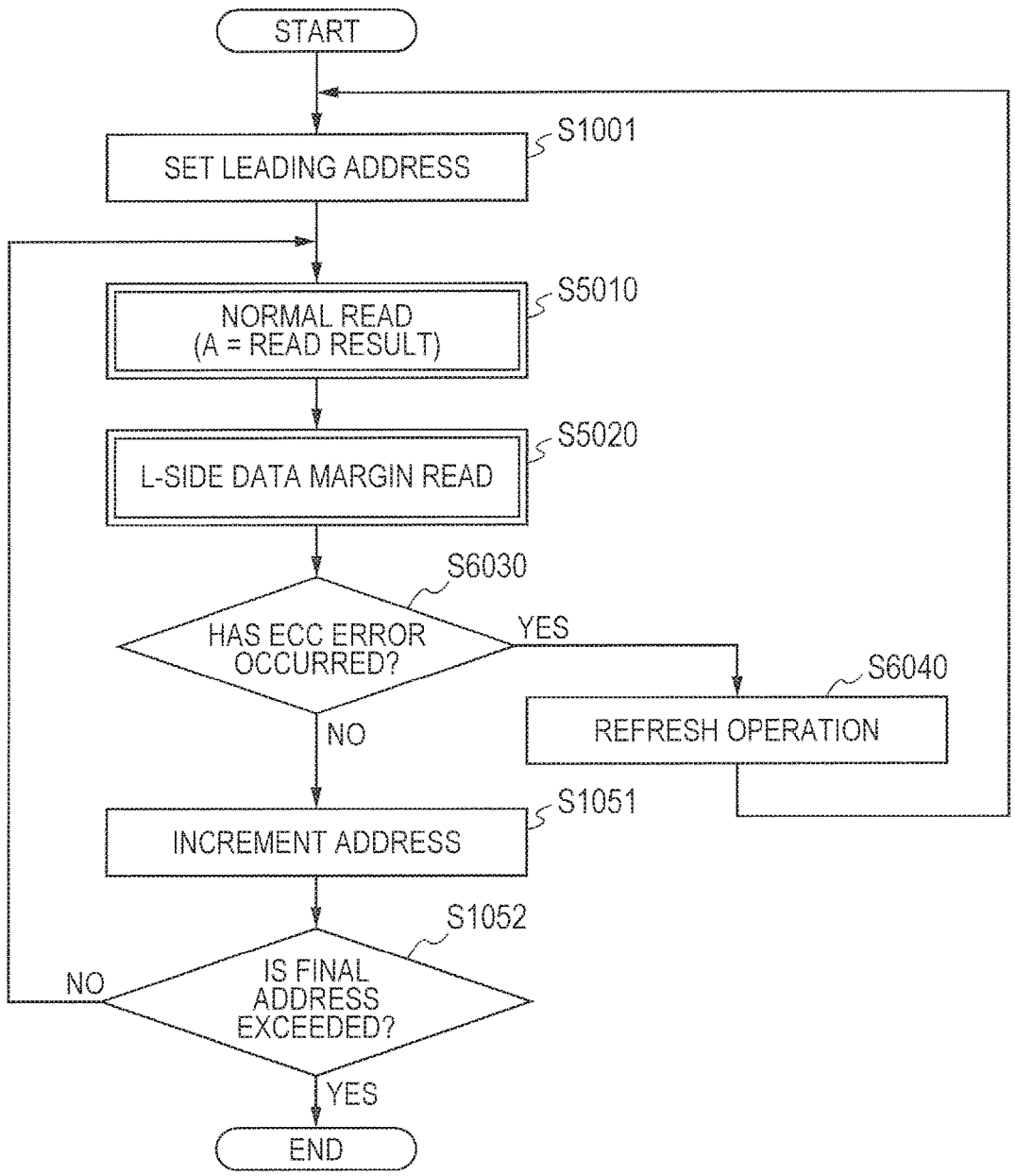
FIG. 26 is a flow chart illustrating the refreshing method of a flash memory according to Embodiment 8 of the present invention.

Next, the refreshing method of the flash memory is explained. FIG. 26 is a flow chart illustrating the refreshing method of the flash memory according to Embodiment 8 of the present invention. In the present embodiment, as illustrated in FIG. 26, after performing the normal read, the L-side data margin read is performed.

At first, at Step S1001, the leading address when performing the normal read and the data 1 margin read to be described later is set up. The leading address may be the leading address of the address space of the nonvolatile memory or may be the leading address of an erasing unit. The word line 152 is selected based on the set-up leading address, and a pair of the memory cells 140 coupled to the word line 152 are selected as the pair of the memory cells 140 as the read target.

Step S5010 is the fourth read step at which the controller 120 performs the normal read. Step S5020 is the seventh read step at which the controller 120 performs the L-side data margin read. Step S5010 and Step S5020 are explained in Embodiment 5. Accordingly, the detailed explanation thereof is omitted here.

At Step S6030, the controller 120 performs the fifth error detection operation in which the error corrector 501 is made to detect the error of the data, based on the data read by the L-side data margin read (the seventh read operation) and the error correcting data.

At Step S6030, for example, the controller 120 outputs the data read by the L-side data margin read to the error corrector 501. The error corrector 501 detects the error of the data read by the L-side data margin read, from the data outputted from the controller 120, and the error correcting data read from the memory array 108 (108A) or a memory device (not shown).

At Step S6030, when the error corrector 501 detects the error of the data read by the L-side data margin read (Yes), Step S6040 is performed.

Next, Step S6040 is explained. In the flash memory 100A, the controller 120 performs the seventh refresh operation in which the error corrector 501 is made to generate the error corrected data of which the error correction has been performed based on the data read by the L-side data margin read and the error correcting data, and the error corrected data is rewritten in the pair of the memory cells 140 as the read target. That is, Step S6040 is the seventh refresh step.

When the seventh refresh operation is performed, the flow shifts to Step S1001, and the detection of the memory cell 140 of which the degradation of the data holding characteristics has advanced is performed again from the leading address. The leading address may be the leading address of the address space of the nonvolatile memory or may be the leading address of an erasing unit. That is, after performing the seventh refresh operation, the controller 120 performs Steps S5010, S5020, and S6030, to the pair of the memory cells 140 (140p, 140n) as the read target.

At Step S6030, when the error corrector 501 does not detect the error of the data read at Step S5020 (No), Step S1051 and Step S1052 are performed sequentially. Step S1051 and Step S1052 are already explained. Accordingly, the detailed explanation thereof is omitted here.

<The Effect by the Present Embodiment>

According to the present embodiment, in addition to the effect in the above-described embodiments, the following effects are obtained. According to the present embodiment, the controller 120 performs the L-side data margin read after performing the normal read.

According to this configuration, also in the flash memory of the complementary system, the margin read is pier formed only to the memory cell 140 which stores the "L" side data and of which the degradation of the data holding characteristics is significant. Accordingly, the memory cell 140 of which the degradation of the data holding characteristics has advanced is detected efficiently. No margin read is performed to the memory cell 140 storing the "H" side data. Accordingly, it is possible to shorten the time required for detecting the memory cell 140 of which the degradation of the data holding characteristics has advanced.

Embodiment 9

Next, Embodiment 9 of the invention is explained. In the embodiments described above, the explanation is made for the case where the memory cell 140 is comprised of the selection transistor 141 and the memory transistor 142. However, the memory cell is not restricted to such a configuration. In the present, embodiment, the case where the memory cell is comprised only of a memory transistor is explained.

FIG. 27 illustrates an example of the circuit configuration of the memory cell according to Embodiment 9 of the present invention. FIG. 28 is a sectional view illustrating an example of the configuration of the memory cell according to Embodiment 9 of the present invention. The memory cell 940 is comprised only of a memory transistor, as illustrated in FIG. 27 and FIG. 28.

As illustrated in FIG. 28, in a semiconductor substrate 940a, a WELL region 940g common to multiple memory cells 940 is formed, and the memory cell 940 is formed over the WELL region 940g. The memory cell 940 has a planer type MONOS structure, for example. As Illustrated in FIG. 28, in the area between a source 942f and a drain 941d, the memory cell 940 has a lamination of an oxide layer (oxide) 942b, a nitride layer (nitride) 942c, an oxide layer (oxide) 942d, and a memory gate (metal) 942e, over the WELL region 940g of the semiconductor substrate (semiconductor) 940a.

The drain 941d of the memory cell 940 is coupled to the bit line 151 (151j, 151jp, 151jn, 151k, 151kp, 151kn), as illustrated in FIG. 27. The memory gate 942e of the memory cell 940 is coupled to the word line 152 as illustrated in FIG. 27, for example. The memory gate 942e of the memory cell 940 may be coupled to the memory gate line 154, for example. The source 942f of the memory transistor 940 is coupled to the source line 153 common to the multiple memory cells 940, as illustrated in FIG. 27.

FIG. 29 illustrates an example of the voltages applied to the memory cell in each operation. FIG. 29 illustrates voltages applied to the bit line 151 (151j, 151jp, 151jn, 151k, 151kp, 151kn), the memory gate 942e, the source line 153, and the WELL region 940g in each of the write operation, the erase operation, and the read operation. FIG. 29 illustrates the case where each operation is performed in an FN tunnel system.

For example, as illustrated in FIG. 29, at the time of the write operation, the following voltages are applied: a voltage of −4V to the bit line 151 (151j, 151jp, 151jn, 151k, 151kp, 151kn), a voltage of 6V to the memory gate 942e (that is, the word line 152), a voltage of −4V to the source line 153, and a voltage of −4V to the WELL region 140g. At the time of the write operation, an electron is injected from a channel by the method called the FN electron injection to the nitride layer 942, to trap the electron to the nitride layer 942c, thereby creating the state where the threshold voltage is high.

For example, as illustrated in FIG. 29, at the time of the erase operation, the following voltages are applied: a voltage of 6V to the bit line 151 (151j, 151jp, 151jn, 151k, 151kp, 151kn), a voltage of −4V to the memory gate 942e (that is, the word line 152), a voltage of 6V to the source line 153, and a voltage of 6V to the WELL region 140g. At the time of the erase operation, a hole is injected from a channel by the method called the FN hole injection, to trap a hole to the nitride layer 942c, thereby creating the state where the threshold voltage is low.

For example, as illustrated in FIG. 29, at the time of the read operation, the following voltages are applied: a voltage of 1.5V to the bit line 151 (151j, 151jp, 151jn, 151k, 151kp, 151kn), a voltage of 1.5V to the memory gate 942e (that is, the word line 152), a voltage of 0V to the source line 153, and a voltage of 0V to the WELL region 140g.

When the number of times of rewriting increases, the ability to trap an electron and a hole in the nitride layer 942c is degraded, and a variation of the threshold voltage in the rewrite state and the erase state become large. Therefore, also in the memory cell 940 that has such a configuration, a series of processing related to the refresh operation explained in the above-described embodiments is performed.

As described above, the invention accomplished by the present inventors has been concretely explained based on the embodiments. However, it cannot be overemphasized that the present invention is not restricted to the embodiments as described above, and it can be changed variously in the range that does not deviate from the gist.

In the following, the desirable main modes of the present invention are remarked in addition.

(Additional Remark 1)

A flash memory is comprised of:

a plurality of memory cells;

a sense amplifier to read data stored in the memory cell;

a bit line potential controller to control the potential of the bit line; and a controller.

In a pair of the memory cells, the data is stored by storing the data in one of the memory cells and storing inverted data obtained by inverting the data in the other of the memory cells.

The sense amplifier is coupled, at an input terminal, to a pair of the bit lines coupled to the pair of the memory cells, and reads the data stored in the pair of the memory cells, based on potential of one of the bit lines coupled to one of the memory cells and potential of the other of the bit lines coupled to the other of the memory cells.

The controller performs a fourth read operation in which one of the memory cells is made to draw out the potential of one of the bit lines, the other of the memory cells is made to draw out the potential of the other of the bit lines, and concurrently, the sense amplifier is made to read the data, a seventh read operation in which, based on the data read by the fourth read operation, the memory cell with a low threshold voltage of the pair of the memory cells is made to draw out the potential of the bit line coupled to the memory cell with the low threshold voltage, the memory cell with a high threshold voltage of the pair of the memory cells and the bit line potential controller are made to draw out the potential of the bit line coupled to the memory cell with a high threshold voltage, and concurrently, the sense amplifier is made to read the data, a fifth data comparison operation in which the data read by the fourth read operation and the data read by the seventh read operation are compared with each other, and a second refresh operation in which, when the data read by the fourth read operation and the data read by the seventh read operation are determined to be different from each other in the fifth data comparison operation, the data and the inverted data stored in the pair of the memory cells are rewritten in the pair of the memory cells.

(Additional Remark 2)

A flash memory is comprised of:

a plurality of memory cells;

a sense amplifier to read data stored in the memory cell;

a bit line potential controller to control the potential of the bit line;

an error corrector to generate error correcting data based on the data, and to correct an error of the data read by the sense amplifier; and a controller.

In the pair of memory cells, the data is stored by storing the data in one of the memory cells and storing inverted data obtained by inverting the data in the other of the memory cells.

The sense amplifier is coupled, at an input terminal, to a pair of the bit lines coupled to the pair of the memory cells, and reads the data stored in the pair of the memory cells, based on potential of one of the bit lines coupled to one of the memory cells and potential of the other of the bit lines coupled to the other of the memory cells.

The controller performs a fourth read operation in which one of the memory cells is made to draw out the potential of one of the bit lines, the other of the memory cells is made to draw out the potential of the other of the bit lines, and concurrently, the sense amplifier is made to read the data, a seventh read operation in which, based on the data read by the fourth read operation, the memory cell with a low threshold voltage of the pair of the memory cells is made to draw out the potential of the bit line coupled to the memory cell with the low threshold voltage, the memory cell with a high threshold voltage of the pair of the memory cells and the bit line potential controller are made to draw out the potential of the bit line coupled to the memory cell with a high threshold voltage, and concurrently, the sense amplifier is made to read the data, a fifth error detection operation in which the error corrector is made to detect an error of the data based on the data read by the seventh read operation and the error correcting data, and a seventh refresh operation in which when the error corrector detects an error of the data read by the seventh read operation in the fifth error detection operation, the error corrector is made to generate the error corrected data of which the error is corrected based on the data read by the seventh read operation and the error correcting data, and the error corrected data is rewritten in the pair of the memory cells.

What is claimed is:

1. A flash memory comprising:

a plurality of memory cells;

a sense amplifier coupled, at an input terminal, to a pair of bit lines coupled to the mutually different memory cells, and to read data stored in the memory cell as a read target, based on potential of one of the bit lines coupled to the memory cell as the read target and potential of the other of the bit lines;

a bit line potential controller to control the potential of the bit lines; and a controller, wherein the controller performs a first read operation in which the memory cell as the read target is made to draw out the potential of one of the bit lines, the bit line potential controller is made to draw out the potential of the other of the bit lines at a first speed, and concurrently, the sense amplifier is made to read the data, a second read operation in which the memory cell as the read target is made to draw out the potential of one of the bit lines, the bit line potential controller is made to draw out the potential of the other of the bit lines at a second speed faster than the first speed, and concurrently, the sense amplifier is made to read the data, a first data comparison operation in which the data read by the first read operation and the data read by the second read operation are compared with each other, and a first refresh operation in which, when the data read by the first read operation and the data read by the second read operation are determined to be different from each other, the data stored in the memory cell as the read target is rewritten in the memory cell of the read target.

2. The flash memory according to claim 1, wherein, when the data read by the first read operation and the data read by the second read operation are determined to be the same, the controller performs a third read operation in which the memory cell as the read target is made to draw out the potential of one of the bit lines, the bit line potential controller is made to draw out the potential of the other of the bit lines at a third speed slower than the first speed, and concurrently, the sense amplifier is made to read the data, and compares the data read by the first read operation and the data read by the third read operation with each other, and wherein, when the data read by the first read operation and the data read by the third read operation are determined to be different, the controller performs the first refresh operation.

3. The flash memory according to claim 1, wherein, after performing the first refresh operation, the controller performs the first read operation, the second read operation, and the first data comparison operation, to the memory cell as the read target.

4. The flash memory according to claim 2, wherein, after performing the first refresh operation, the controller performs the first read operation, the second read operation, the first data comparison operation, the third read operation, and the second data comparison operation to the memory cell as the read target.

5. The flash memory according to claim 1, further comprising:

a memory array including a plurality of memory mats in which a plurality of the memory cells are arranged in a matrix, wherein the bit line is provided for each of the memory mats, and wherein each of the bit lines is coupled to a common bit line arranged common to the memory mats, via a bit line selecting-switching element.

6. The flash memory according to claim 5, wherein, in the memory mat, the memory cells are arranged in a matrix in a first direction and a second direction, wherein a plurality of the bit lines are provided for every memory cells for one line arranged in the second direction, and wherein each of the bit lines is coupled to an input terminal of the sense amplifier via a read memory cell selecting-switching element.

7. The flash memory according to claim 6, wherein the sense amplifier is provided for each pair of the memory mats, and wherein the bit line of each of the memory mats is coupled to an input terminal of the sense amplifier.

8. The flash memory according to claim 6, wherein the memory cells for one line arranged in the second direction in each of the memory mats are same in number.

9. A flash memory comprising:

a plurality of memory cells;

a sense amplifier to read data stored in the memory cell;

a bit line potential controller to control the potential of the bit line; and a controller, wherein data is stored in a pair of the memory cells, by storing the data in one of the memory cells and storing inverted data obtained by inverting the data in the other of the memory cells, wherein the sense amplifier is coupled, at an input terminal, to a pair of bit lines coupled to the pair of the memory cells, and reads the data stored in the pair of the memory cells, based on potential of one of the bit lines coupled to one of the memory cells and potential of the other of the bit lines coupled to the other of the memory cells, wherein the controller performs a fourth read operation in which one of the memory cells is made to draw out the potential of one of the bit lines, the other of the memory cells is made to draw out the potential of the other of the bit lines, and concurrently, the sense amplifier is made to read the data, a fifth read operation in which one of the memory cells is made to draw out the potential of one of the bit lines, the other of the memory cells and the bit line potential controller are made to draw out the potential of the other of the bit lines, and concurrently, the sense amplifier is made to read the data, a third data comparison operation in which the data read by the fourth read operation and the data read by the fifth read operation are compared with each other, and a second refresh operation in which, when the data read by the fourth read operation and the data read by the fifth read operation are determined to be different from each other in the third data comparison operation, the data and the inverted data stored in the pair of memory cells are rewritten in the pair of memory cells.

10. The flash memory according to claim 9, wherein, when the data read by the fourth read operation and the data read by the fifth read operation is determined to be the same, the controller performs a sixth read operation in which the one of the memory cells and the bit line potential controller are made to draw out the potential of the one of the bit lines, the other of the memory cells is made to draw out the potential of the other of the bit lines, and concurrently, the sense amplifier is made to read the data, a fourth data comparison operation in which the data read by the fourth read operation and the data read by the sixth read operation are compared, and the second refresh operation, when the data read by the fourth read operation and the data read by the sixth read operation are determined to be different from each other in the fourth data comparison operation.

11. The flash memory according to claim 9, wherein, after performing the second refresh operation, the controller performs the fourth read operation, the fifth read operation, and the third data comparison operation to the pair of the memory cells.

12. The flash memory according to claim 10, wherein, after performing the second refresh operation, the controller performs the fourth read operation, the fifth read operation, the third data comparison operation, the third read operation, and the second data comparison operation to the pair of the memory cells.

13. A flash memory comprising:

a plurality of memory cells;

a sense amplifier coupled, at an input terminal, to a pair of bit lines coupled to the mutually different memory cells, and to read the data stored, in the memory cell as a read target, based on potential of one of the bit lines coupled to the memory cell as the read target and potential of the other of the bit lines;

a bit line potential controller to control the potential of the bit line; and an error corrector to generate error correcting data based on the data, and to generate error corrected data after correcting the error of the data read by the sense amplifier; and a controller, wherein the controller performs a second read operation in which the memory cell as the read target is made to draw out the potential of one of the bit lines, the bit line potential controller is made to draw out the potential of the other of the bit lines at a second speed faster than a first speed, and concurrently, the sense amplifier is made to read the data, a first error detection operation in which the error corrector is made to detect an error of the data based on the data read by the second read operation and the error correcting data, and a third refresh operation in which, when the error corrector detects an error of the data read by the second read operation in the first error detection operation, the error corrector is made to generate the error corrected data of which the error is corrected based on the data read by the second read operation and the error correcting data, and the error corrected data is rewritten in the memory cell as the read target.

14. The flash memory according to claim 13,
wherein, when it is determined that there is no error in the data read by the second read operation in the first error detection operation,
the controller performs a third read operation in which the memory cell as the read target is made to draw out the potential of one of the bit lines, the bit line potential controller is made to draw out the potential of the other of the bit lines at a third speed slower than the first speed, and concurrently, the sense amplifier is made to read the data, a second error detection operation in which the error corrector is made to detect the error of the data based on the data read by the third read operation and the error correcting data, and a fourth refresh operation in which, when the error corrector detects an error of the data read by the third read operation in the second error detection operation, the error corrector is made to generate error corrected data of which the error is corrected based on the data read by the third read operation and the error correcting data, and the error corrected data is rewritten in the memory cell as the read target.

15. The flash memory according to claim 13,
wherein, after performing the third refresh operation, the controller performs the second read operation and the first error detection operation to the memory cell as the read target.

16. The flash memory according to claim 14,
wherein, after performing the fourth refresh operation, the controller performs the second read operation, the first error detection operation, the third read operation, and the second error detection operation to the memory cell as the read target.

17. A flash memory comprising:
a plurality of memory cells;
a sense amplifier to read data stored in the memory cell;
a bit line potential controller to control the potential of the bit line; and
an error corrector to generate error correcting data based on the data and to correct an error of the data read by the sense amplifier; and
a controller,
wherein data is stored in a pair of the memory cells, by storing the data in one of the memory cells and storing inverted data obtained by inverting the data in the other of the memory cells, wherein the sense amplifier is coupled, at an input terminal, to a pair of bit lines coupled to the pair of the memory cells, and reads the data stored in the pair of the memory cells, based on potential of one of the bit lines coupled to one of the memory cells and potential of the other of the bit lines coupled to the other of the memory cells, wherein the controller performs a fifth read operation in which one of the memory cells is made to draw out the potential of one of the bit lines, the other of the memory cells and the bit line potential controller are made to draw out the potential of the other of the bit lines, and concurrently, the sense amplifier is made to read the data, a third error detection operation in which the error corrector is made to detect an error of the data based on the data read by the fifth read operation and the error correcting data, and a fifth refresh operation in which, when the error corrector detects an error of the data read by the fifth read operation in the third error detection operation, the error corrector is made to generate the error corrected data of which the error is corrected based on the data read by the fifth read operation and the error correcting data, and the error corrected data is rewritten in the pair of the memory cells.

18. The flash memory according to claim 17,
wherein, when it is determined that there is no error in the data read by the fifth read operation in the third error detection operation,
the controller performs a sixth read operation in which the one of the memory cells and the bit line potential controller are made to draw out the potential of the one of the bit lines, the other of the memory cells is made to draw out the potential of the other of the bit lines, and concurrently, the sense amplifier is made to read the data, and a fourth error detection operation in which the error corrector is made to detect an error of the data based on the data read by the sixth read operation and the error correcting data, and a sixth refresh operation in which, when the error corrector detects an error of the data read by the sixth read operation in the fourth error detection operation, the error corrector is made to generate the error corrected data of which the error is corrected based on the data read by the sixth read operation and the error correcting data, and the error corrected data is rewritten in the pair of the memory cells.

19. The flash memory according to claim 17,
wherein, after performing the fifth refresh operation, the controller performs the fifth read operation and the third error detection operation to the memory cell as the read target.

20. The flash memory according to claim 18,
wherein, after performing the sixth refresh operation, the controller performs the fifth read operation, the third error detection operation, the sixth read operation, and the fourth error detection operation to the memory cells as the read target.

* * * * *